United States Patent
Kanaoka et al.

(10) Patent No.: US 7,620,882 B2
(45) Date of Patent: Nov. 17, 2009

(54) DECODER AND DECODING METHOD FOR DECODING A CODE BY SELECTING A PATH OUT OF PATHS IN A TRELLIS DIAGRAM

(75) Inventors: Toshikazu Kanaoka, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 11/394,266

(22) Filed: Mar. 30, 2006

(65) Prior Publication Data
US 2007/0168843 A1 Jul. 19, 2007

(30) Foreign Application Priority Data
Dec. 15, 2005 (JP) ............... 2005-362341

(51) Int. Cl.
*H03M 13/03* (2006.01)
(52) U.S. Cl. .............. 714/794; 714/792; 714/795; 714/796; 375/263; 375/341
(58) Field of Classification Search ......... 714/792–796; 375/265, 341
See application file for complete search history.

(56) References Cited

U.S. PATENT DOCUMENTS

| | | | | |
|---|---|---|---|---|
| 5,537,424 A | * | 7/1996 | Karabed et al. | ............. 714/795 |
| 5,838,697 A | * | 11/1998 | Abe | ............. 714/796 |
| 6,122,118 A | * | 9/2000 | Sato et al. | ............. 360/46 |
| 6,335,841 B1 | | 1/2002 | Hirano et al. | |
| 6,373,413 B1 | * | 4/2002 | Yoshinaka | ............. 341/94 |
| 6,388,587 B1 | | 5/2002 | Brickner et al. | |
| 6,668,349 B1 | | 12/2003 | Sawaguchi | |
| 6,704,154 B2 | | 3/2004 | Hirano et al. | |
| 7,076,721 B2 | | 7/2006 | Sawaguchi | |
| 7,120,855 B2 | * | 10/2006 | Chen et al. | ............. 714/795 |
| 7,177,353 B2 | * | 2/2007 | Abnous et al. | ............. 375/233 |
| 7,199,955 B2 | | 4/2007 | Hirano et al. | |

(Continued)

FOREIGN PATENT DOCUMENTS

JP 2000-332619 11/2000

(Continued)

OTHER PUBLICATIONS

Osawa et al.; "Signal Processing Technologies for High Density Digital Magnetic Recording"; The Transactions of the Institute of Electronics, Information and Communication Engineers; vol. J81-C-II, No. 4, pp. 393-412; Apr. 1998.

(Continued)

*Primary Examiner*—Esaw T Abraham
(74) *Attorney, Agent, or Firm*—Greer, Burns & Crain, Ltd.

(57) ABSTRACT

A decoder decodes a code by selecting, based on a predetermined condition, a path out of paths representing a transition of each of states in a trellis diagram. A storing unit stores, when a path at time k is selected, information on a selection history of a path selected at time prior to time (k−(a constraint length of a code)+1). A path detecting unit detects a path to be excluded from a path selection candidate, based on the information stored in the storing unit and information on a state of a transition source when a state transition occurs from time k−1 to time k.

10 Claims, 24 Drawing Sheets

U.S. PATENT DOCUMENTS

| | | | |
|---|---|---|---|
| 7,237,173 B2 | 6/2007 | Morita et al. | |
| 7,380,199 B2 * | 5/2008 | Haratsch | 714/796 |
| 2003/0043487 A1 | 3/2003 | Morita et al. | |
| 2007/0079225 A1 * | 4/2007 | Graef | 714/795 |

FOREIGN PATENT DOCUMENTS

| | | |
|---|---|---|
| JP | 2002-8325 | 1/2002 |
| JP | 2003-504778 | 2/2003 |
| JP | 2003-068024 | 3/2003 |
| WO | WO 01/03304 | 1/2001 |

OTHER PUBLICATIONS

Brickner, et al.; "Design of a Rate 6/7 Maximum Transition Run Code"; IEEE Transactions on Magnetics, vol. 33, No. 5, pp. 2749-2751; Sep. 1997.

Nishiya et al.; "Rate 16/17 Maximum Transition run (3; 11) Code on an EEPRML Channel with an Error-Correcting Postprocessor"; IEEE Transactions on Magnetics, vol. 35, No. 5, pp. 4378-4386; Sep. 1999.

* cited by examiner

FIG.4

| INPUT / PRIOR STATE | PRESENT STATE | | DECODER INPUT $d_k^{mn}$ | |
|---|---|---|---|---|
| | 0 | 1 | 0 | 1 |
| $S_0$ | $S_0$ | $S_1$ | $d_k^{00}=0$ | $d_k^{01}=0$ |
| $S_1$ | $S_2$ | $S_3$ | $d_k^{12}=0$ | $d_k^{13}=0$ |
| $S_2$ | $S_0$ | $S_1$ | $d_k^{20}=0$ | $d_k^{21}=0$ |
| $S_3$ | $S_2$ | $S_3$ | $d_k^{32}=0$ | $d_k^{33}=0$ |

FIG.13
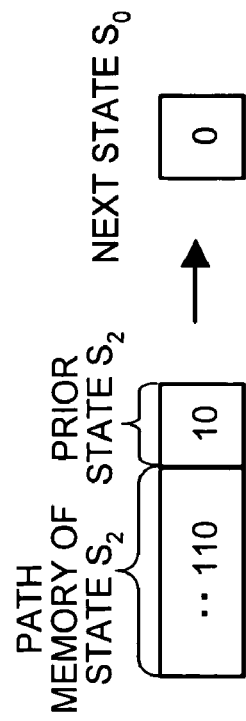
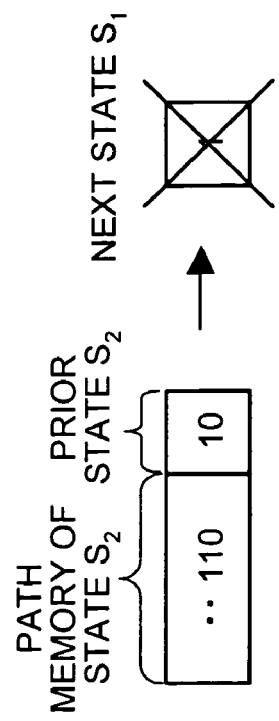
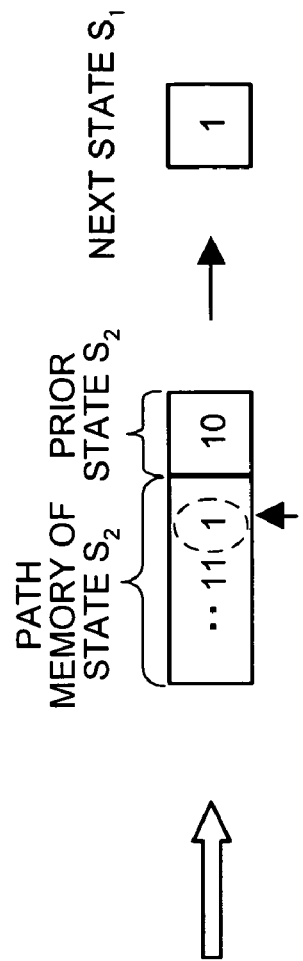

FIG.18

| PATH-SELECTION PROHIBITING FLAG | INVALID | VALID |
|---|---|---|
| JUDGMENT RESULT | decA | NON-EXCLUDED PATH IS SELECTED → decB<br>EXCLUDED PATH IS SELECTED → decC |

FIG.19

| JUDGMENT RESULT | COMPARE OPERATION RESULT | $\hat{u}_j^0 \neq \hat{u}_j^2$ | $\hat{u}_j^0 = \hat{u}_j^2$ |
|---|---|---|---|
| decA | TRUE | $\hat{L}_j(S_1(k)) = \min\{\Delta_1(k), \hat{L}_j^0\}$ | $\hat{L}_j(S_1(k)) = \min\{\Delta_1(k) + \hat{L}_j^2, \hat{L}_j^0\}$ |
| decA | FALSE | $\hat{L}_j(S_1(k)) = \min\{\Delta_1(k), \hat{L}_j^2\}$ | $\hat{L}_j(S_1(k)) = \min\{\Delta_1(k) + \hat{L}_j^0, \hat{L}_j^2\}$ |
| decB | TRUE | $\hat{L}_j(S_1(k)) = \hat{L}_j^0$ | $\hat{L}_j(S_1(k)) = \hat{L}_j^2$ |
| decC | FALSE | $\hat{L}_j(S_1(k)) = \hat{L}_j^2$ | $\hat{L}_j(S_1(k)) = \hat{L}_j^0$ |

| INPUT / PRIOR STATE | PRESENT STATE | | DECODER INPUT $d_k^{mn}$ | |
|---|---|---|---|---|
| | 0 | 1 | 0 | 1 |
| $S_0$ | $S_0$ | $S_1$ | $d_k^{00}=0$ | $d_k^{01}=1$ |
| $S_1$ | $S_0$ | $S_1$ | $d_k^{10}=1$ | $d_k^{11}=2$ |

DECODER AND DECODING METHOD FOR DECODING A CODE BY SELECTING A PATH OUT OF PATHS IN A TRELLIS DIAGRAM

BACKGROUND OF THE INVENTION

1. Field of the Invention

The present invention relates to a decoder that decodes a code by selecting a path out of paths representing transitions of each of states in a trellis diagram based on a predetermined condition, a decoder that decodes a code sequence encoded using a maximum-transition-run (MTR) code and an error correcting code, and an encoder that encodes an information sequence, and more particularly, to a decoder and a decoding method that can efficiently delete a path not satisfying a predetermined limitation to obtain a large gain without increasing a constraint length of a code.

2. Description of the Related Art

Conventionally, a technology called a partial-response-maximum-likelihood (PRML) system obtained by combining a partial-response (PR) system and a maximum-likelihood (ML) method has been developed as a data reproduction technique for a magnetic disk device (see, for example, Osawa, Okamoto, Saito, "Signal Processing Technology for High-Density Digital Magnetic Recording", the Institute of Electronics, Information and Communication Engineers Transaction, C-II Vol. J81-C-II, No. 4, pp. 393-412, April 1998).

The partial-response System is a technology for realizing high density of information by introducing known intersymbol interference. For example, in a PR1 system (also referred to as the PR(1,1) system) that is a type of the partial-response system, a transfer characteristic 1+D (D represents a delay of 1 bit) is given to a record information sequence consisting of bits of "1" and "0" by a partial-response (PR) channel. In this case, a sum of a bit at time k and a bit at time k−1 is calculated to convert the record information sequence into a signal sequence taking three values of "0", "1", and "2".

It is possible to extend the transfer characteristic of the partial-response system in such a manner as $$a+bD+cD^2+dD^3+\ldots$$

A value obtained by adding one to a highest order of this transfer characteristic is referred to as a PR constraint length. For example, the PR constraint length is two in the PR1 system, and three in a PR2 system (also referred to as the PR(1,2,1) system, a transmission characteristic of which is $1+2D+D^2$).

The maximum-likelihood method is a decoding method of defining a state that can be taken within an infinite time, selecting a most likely transition in temporal transitions of the state, and outputting an input sequence corresponding to the selected transition as a decoded sequence.

FIG. 26 is a state transition table in a conventional PR1ML system obtained by combining the PR1 system and the maximum-likelihood method. FIG. 27 is a trellis diagram in the conventional PR1ML system.

The state transition table is a table of a correspondence relation between transitions of a state $S_0$ corresponding to an input signal "0" and a state $S_1$ corresponding to an input signal "1" and a value of a decoder input (also referred to as a decoding expected value). In the table, $d_k^{mn}$ represents a value of a decoder input at the time when a state transitions from a state $S_m$ at time k−1 to a state $S_n$ at time k. The trellis diagram represents transitions of the states $S_0$ and $S_1$ as a diagram.

In the Viterbi decoding method, taking into account state transitions in the past based on the trellis diagram, a most likely path is selected by comparing paths transitioning to the present state. FIG. 28 is a diagram for explaining path selection processing using the conventional Viterbi decoding method.

As shown in FIG. 27, in the state $S_0$ at time k, there are paths that transition from the state $S_0$ and the state $S_1$ at time k−1. In the Viterbi decoding method, a likely path is selected by calculating path metrics, that is, square Euclidian distances in the two paths. The same processing is executed on the state $S_1$ at time k. After ending the path selection processing, a path memory holds information on the states $S_0$ and $S_1$ at transition sources in the selected path.

When paths are selected in this way, the paths merge at certain time. For example, in FIG. 28, paths merge at time k−5 and time k−1. When the paths merge in this way, a path at time before the merger is decided to be unified. This unified path is called a survival path. The survival path is outputted as a decoding result.

FIG. 29 is a diagram of the functional constitution of the conventional maximum-likelihood decoder. This maximum-likelihood decoder includes a BM calculating unit 1, an ACS calculating unit 2, a path memory 3, and a PM memory 4.

The BM calculating unit 1 calculates a likelihood called a branch metric (BM) with respect to a sample value (a signal obtained by adding noise of a channel to a decoder input).

The ACS calculating unit 2 performs an ACS (ADD, COMPARE, SELECT) operation for adding up a path metric in a state at time k−1 and a branch metric at the time when a state transitions from time k−1 to time k and selecting a path through comparison of magnitudes of path metrics in the state at time k obtained by the addition.

The path memory 3 stores information on a selected path. Since two paths extend from one state, for example, "0" is allocated to a path in the upper part and "1" is allocated to a path in the lower part in the trellis diagram shown in FIG. 27 to specify a selected path.

The PM memory 4 stores a path metric (PM) calculated by the ACS calculating unit 2 to use the path metric in an ACS operation at the next time.

A maximum-transition-run (MTR) code that limits the number consecutive transitions in such a maximum-likelihood decoder using the Viterbi decoding method has been developed. When the MTR code is used, it is possible to control a recording frequency and prevent occurrence of consecutive errors peculiar to the high-order PRML system.

For example, as a type of an extended-partial-response 4 maximum-likelihood (EPR4ML) system that is the PRML system, a PR constraint length of which is 4, there is a 6/7 MTR encoding EPR4ML system to which a 6/7 MTR code for limiting three consecutive transitions "0101" and "1010" in codes is applied (see, for example, B. Brickner, J. Moon, "Design of a Rate 6/7 Maximum Transition Run Code", IEEE Transactions on Magnetics, Vol. 33, No. 5, September 1997).

FIG. 30 is a diagram for explaining the 6/7 MTR encoding EPR4ML system. In FIG. 30, trellis diagrams representing transitions from states $S_m$ (m=0 to 7) at time k−1 to states $S_n$ (n=0 to 7) at time k are shown with respect to the EPR4ML system and the 6/7 MTR encoding EPR4ML system, respectively. In the figure, $a_k$ represents a decoded value at time k.

In the EPR4ML system, since there is a path that transitions from the state $S_2$ to the state $S_5$, three consecutive transitions "0101" occur. However, in the 6/7 MTR encoding EPR4ML system, since a path that transitions from the state $S_2$ to the state $S_5$ (this path is represented by a bit "1") is deleted (path cut) based on information on a bit string "010" representing the prior state $S_2$, it is possible to prevent occurrence of the three consecutive transitions. When the path is deleted, since there is only one path leading to the state $S_5$, path selection processing is not performed.

Similarly, in the EPR4ML system, since there is a path that transitions from the state $S_5$ to the state $S_2$, three consecutive transitions "1010" occur. However, in the 6/7 MTR encoding EPR4ML system, since a path that transitions from the state $S_5$ to the state $S_2$ (this path is represented by a bit "0") is deleted based on information on a bit string "101" representing the prior state $S_2$, it is possible to prevent occurrence of the three consecutive transitions.

It is desirable that a limit length of a consecutive transition is as small as possible and an encoding rate is as high as possible. However, actually, a logical limit is present. A 16/17 MTR code has been developed as an MTR code for limiting four consecutive transitions (see, for example, T. Nishiya, K. Tsukano, T. Hirai, S. Mita, T. Nara, "Rate 16/17 Maximum Transition Run (3;11) Code on an EEPRML Channel with an Error-Correcting Postprocessor", IEEE Transactions on Magnetics, Vol. 35, No. 5, September 1999).

By using such a method, it is possible to remove all patterns in which a signal sequence "010 . . . " is misunderstood as a signal sequence "101 . . . " or all patterns in which a signal sequence "101 . . . " is misunderstood as a signal sequence "010 . . . ". It is possible to improve a gain of a signal.

However, in the conventional technologies, the number of states of the maximum-likelihood decoder that prevents occurrence of a consecutive transition with a length L, has to be set to $2^L$ or more. In general, the number of states of a maximum-likelihood decoder depends on a PR constraint length. In other words, to prevent occurrence of the consecutive transition with a length L, it is necessary to set the PR constraint length larger than a consecutive transition limit length to satisfy a condition for the number of states. For example, in the MTR code that prohibits the three consecutive transitions, it is necessary to set the PR constraint length to 4 and set the number of states of the maximum-likelihood decoder to $2^{(4-1)}=8$.

When the PR constraint length of the maximum-likelihood decoder increases, a circuit size of the maximum-likelihood decoder markedly increases. For example, when the PR constraint length increases by 1, the circuit size is doubled. Therefore, it is important to efficiently delete a path that does not satisfy limitations such as the consecutive transition limit length to obtain a large gain without increasing the PR constraint length.

SUMMARY OF THE INVENTION

It is an object of the present invention to at least solve the problems in the conventional technology.

A decoder according to one aspect of the present invention decodes a code by selecting, based on a predetermined condition, a path out of paths representing a transition of each of states in a trellis diagram. The decoder includes a storing unit that stores, when a path at time k is selected, information on a selection history of a path selected at time prior to time (k−(a constraint length of a code)+1); and a path detecting unit that detects a path to be excluded from a path selection candidate, based on the information stored in the storing unit and information on a state of a transition source when a state transition occurs from time k−1 to time k.

A decoder according to another aspect of the present invention decodes a code sequence encoded using a maximum-transition-run code and further encoded using an error correcting code. The decoder includes an error correcting unit that performs an error correction using an error correcting code included in the code sequence; and a maximum-transition-run decoding unit that decodes, after the error correction is performed by the error correcting unit, the code sequence using the maximum-transition-run code.

An encoder according to still another aspect of the present invention includes a maximum-transition-run encoding unit that encodes an information sequence using a maximum-transition-run code; and an error-correction encoding unit that encodes the information sequence encoded by the maximum-transition-run encoding unit using an error correcting code.

A method according to still another aspect of the present invention is for decoding a code by selecting, based on a predetermined condition, a path out of paths representing a transition of each of states in a trellis diagram. The method includes storing, when a path at time k is selected, information on a selection history of a path selected at time prior to time (k−(a constraint length of a code)+1); and detecting a path to be excluded from a path selection candidate, based on the information stored at the storing and information on a state of a transition source when a state transition occurs from time k−1 to time k.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a state transition table at the time when the number of states is 4;

FIG. 13 is a diagram for explaining the ACS calculating process according to the fifth embodiment;

FIG. 18 is a table of judgment criteria in excluded-path selection judgment;

FIG. 19 is a table for explaining a method of calculating a logarithmic likelihood ratio;

DETAILED DESCRIPTION OF THE PREFERRED EMBODIMENTS

Exemplary embodiments of the present invention are explained in detail below with reference to the accompanying drawings.

Figure 1:
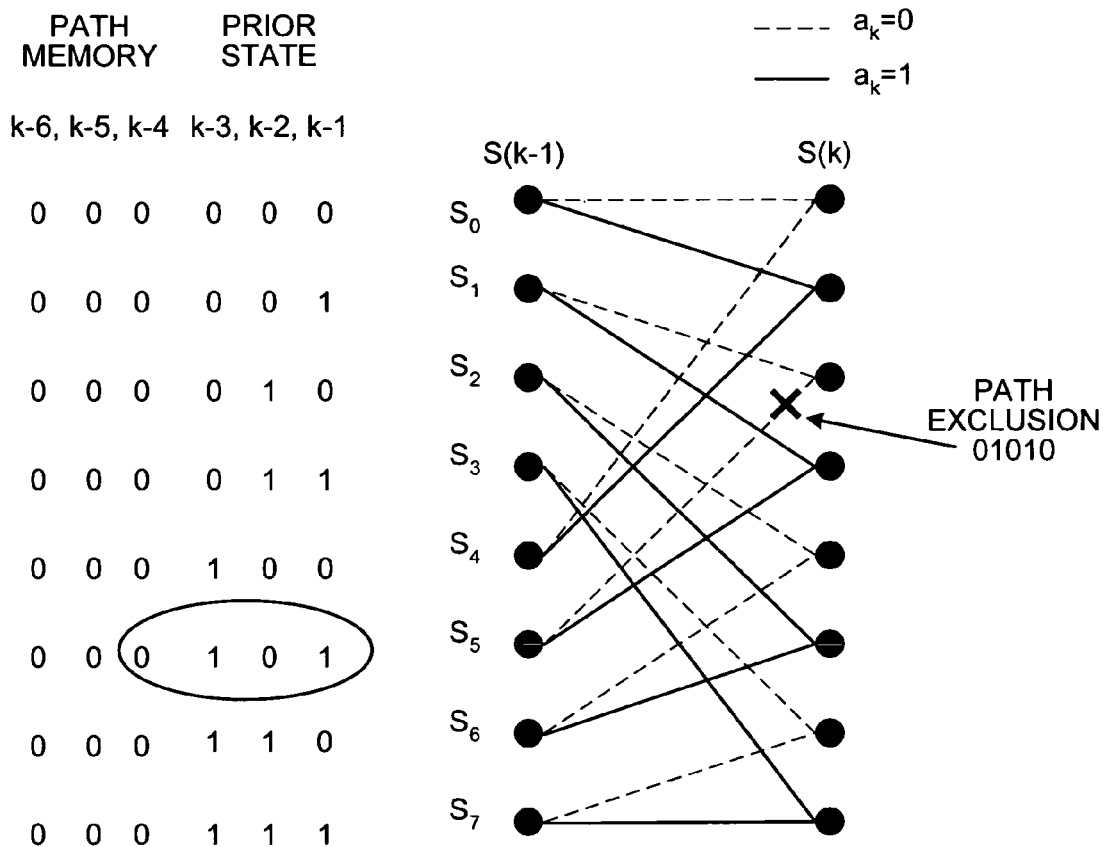
FIG. 1 is a diagram for explaining a concept of decoding processing according to the present invention.

FIG. 1 is a diagram for explaining the concept of the decoding processing according to the present invention. An example of decoding processing, a PR constraint length of which is 4 (the number of states of which is 8) and which prohibits four consecutive transitions, is shown in FIG. 1.

As shown in FIG. 1, in this decoding processing, unlike the method explained with reference to FIG. 30, all transition paths of a maximum-likelihood decoder are present. A path memory stores, when a path at time k is selected, information concerning a selection history of paths selected at time before time (k−(a PR constraint length)+1), that is, time k−3.

In the decoding processing, bit values in the path memory corresponding to states $S_0$ to $S_7$ and bit values representing the prior states $S_0$ to $S_7$ at time k−1 are monitored. A prohibited path (in FIG. 1, a path with a bit string "01010") in a state transition at the next time k is detected and deleted.

It is possible to efficiently delete a path that does not satisfy a consecutive transition limit length to obtain a large gain without increasing a constraint length of a PR code by referring to the bit values stored in the path memory.

Figure 2:
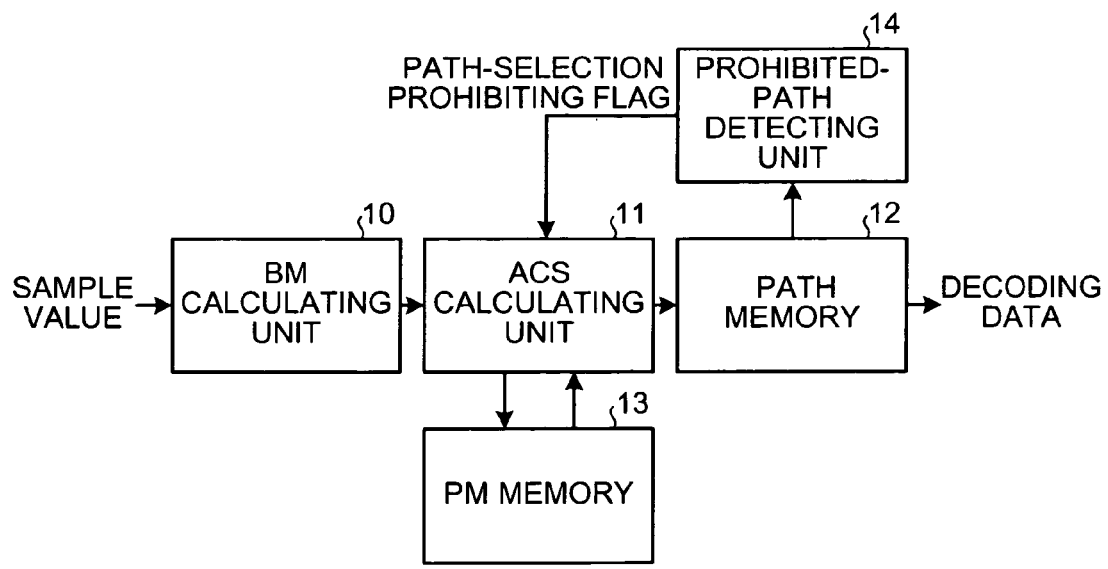
FIG. 2 is a diagram of a functional constitution of a maximum-likelihood decoder according to a first embodiment of the present invention.

FIG. 2 is a diagram of a functional constitution of a maximum-likelihood decoder according to a first embodiment of the present invention. As shown in FIG. 2, this maximum-likelihood decoder includes a BM calculating unit 10, an ACS calculating unit 11, a path memory 12, a PM memory 13, and a prohibited-path detecting unit 14.

The BM calculating unit 10 calculates a likelihood called a branch metric with respect to a sample value (a signal obtained by adding noise of a channel to a decoder input). Specifically, the BM calculating unit 10 calculates, according to following equation, a branch metric $BM_{mn}(k)$ at the time when a state transitions from a state $S_m$ to a state $S_n$ at time k.

$$BM_{mn}(k) = -\ln\left\{\frac{1}{\sqrt{2\pi\sigma^2}}\exp\left(-\frac{(y_k - d_k^{mn})^2}{2\sigma^2}\right)\right\} \quad (1)$$

where $\sigma^2$ is variance of white Gaussian noise, $y_k$ is a decoder input at time k, and $d_k^{mn}$ is an expected value of $y_k$ at time k.

The ACS calculating unit 11 performs an ACS operation for adding up a path metric in a state at time k−1 and a branch metric at the time when a state transitions from time k−1 to time k and selecting a path through comparison of magnitudes of path metrics in the state at time k obtained by the addition.

Specifically, the ACS calculating unit 11 calculates, according to following equations, path metrics $PM_n^0(k)$ and $PM_n^1(k)$ of two paths that transition from the state $S_m$ and a state $S_{m'}$ to the state $S_n$ at time k.

$$PM_n^0(k) = PM_m(k-1) + BM_{mn}(k) \quad (2)$$

$$PM_n^1(k) = PM_{m'}(k-1) + BM_{m'n}(k) \quad (3)$$

where $PM_m(k-1)$ and $PM_{m'}(k-1)$ are path metrics of the state $S_m$ and the state $S_{m'}$ at time k−1, respectively, and $BM_{mn}(k)$ and $BM_{m'n}(k)$ are branch metrics at the time when a state transitions from the state $S_m$ and the state $S_{m'}$ to the state $S_n$, respectively.

The ACS calculating unit 11 compares magnitudes of the path metrics $PM_n^0(k)$ and $PM_n^1(k)$ of the two paths and selects a path based on the following equation.

$$PM_n(k) = \begin{cases} PM_n^0(k): PM_n^0(k) < PM_n^1(k) \\ PM_n^1(k): PM_n^0(k) \geq PM_n^1(k) \end{cases} \quad (4)$$

In that case, the ACS calculating unit 11 acquires information indicating whether a path-selection prohibiting flag explained later is valid from the prohibited-path detecting unit 14 and, when there is a path for which the path-selection prohibiting flag is valid, excludes the path from objects of selection of a path.

Specifically, the ACS calculating unit 11 sets the branch metric $BM_{m'n}(k)$ of the path for which the path-selection prohibiting flag is valid to an extremely large value ∞ as indicated by following equations to prevent the path from being selected.

$$PM_n^0(k) = PM_m(k-1) + BM_{mn}(k) \quad (5)$$

$$PM_n^1(k) = PM_{m'}(k-1) + \infty \quad (6)$$

$$PM_n(k) = PM_n^0(k) \quad (7)$$

When a path is selected, the ACS calculating unit 11 copies content of a path memory corresponding to a state at a transition source of a state transition specified by the path to a path memory corresponding to a state at a transition destination. The ACS calculating unit 11 stores a value of a first bit of bits representing the state at the transition source in the path memory corresponding to the state at the transition destination.

For example, when a bit string "...00111" is stored in a path memory of a state $S_1$ represented by "01" at time k−1 and a transition path from the state $S_1$ to a state $S_2$ is selected at time k, the ACS calculating unit 11 copies content "...00111" of a path memory of a state $S_0$ to a path memory of the state $S_2$. The ACS calculating unit 11 stores a value "0" of the first bit of bits "01" representing the state $S_1$ at the transition source in the path memory of the state $S_2$. Therefore, content of the path memory of the state $S_2$ is "...001110".

The path memory 12 stores information on a selected path. A survival path is retrieved based on the information stored in the path memory 12 and read out as decoding data.

The PM memory 13 stores a path metric calculated by the ACS calculating unit 11. The path metric stored by the PM memory 13 is read out by the ACS calculating unit 11 when the ACS operation is executed at the next time k+1.

The prohibited-path detecting unit 14 performs, for each bit, detection of coincidence of values between a specific prohibited pattern and a path memory. When there is a path in which all bits coincide with the prohibited pattern, the prohibited-path detecting unit 14 validates a path-selection prohibiting flag corresponding to the path.

Figure 3:
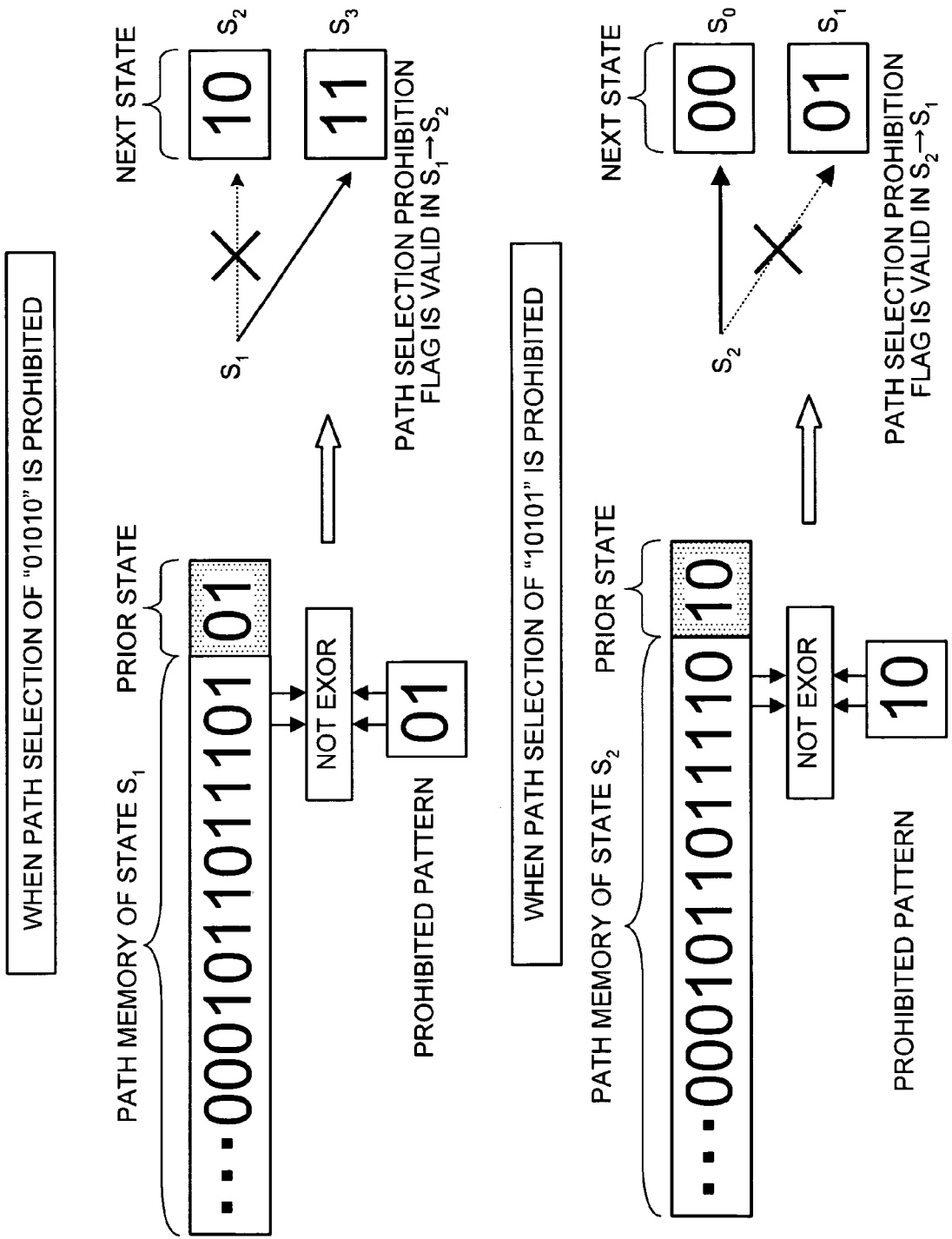
FIG. 3 is a diagram for explaining prohibited path detection processing according to the first embodiment.

FIG. 3 is a diagram for explaining prohibited path detection processing according to the first embodiment. Prohibited path detection processing at the time when a PR constraint length of the maximum-likelihood decoder is 3 and the number of states thereof is 4 is shown in FIG. 3. FIG. 4 is a state transition table at the time when the number of states is 4. A decoder input $d_k^{mn}$ represents a decoder input at the time when a state transitions from a prior state $S_m$ to a present state $S_n$ at the present time k.

As shown in FIG. 3, the prohibited-path detecting unit 14 judges whether a value stored in the path memory 12 and each value of a prohibited pattern coincide with each other. It is possible to execute this coincidence judgment by calculating negation of exclusive OR (not EXOR) for each bit.

When a bit string formed by the prohibited pattern, a prior state, and the next state is "10101" or "01010" having the four consecutive transitions, to prohibit selection of a transition path to the next state that causes the four consecutive transitions (from the state $S_2$ to the state $S_1$ or from the state $S_1$ to the state $S_3$), the prohibited-path detecting unit 14 validates a path-selection prohibiting flag corresponding to the transition path.

Figure 5:
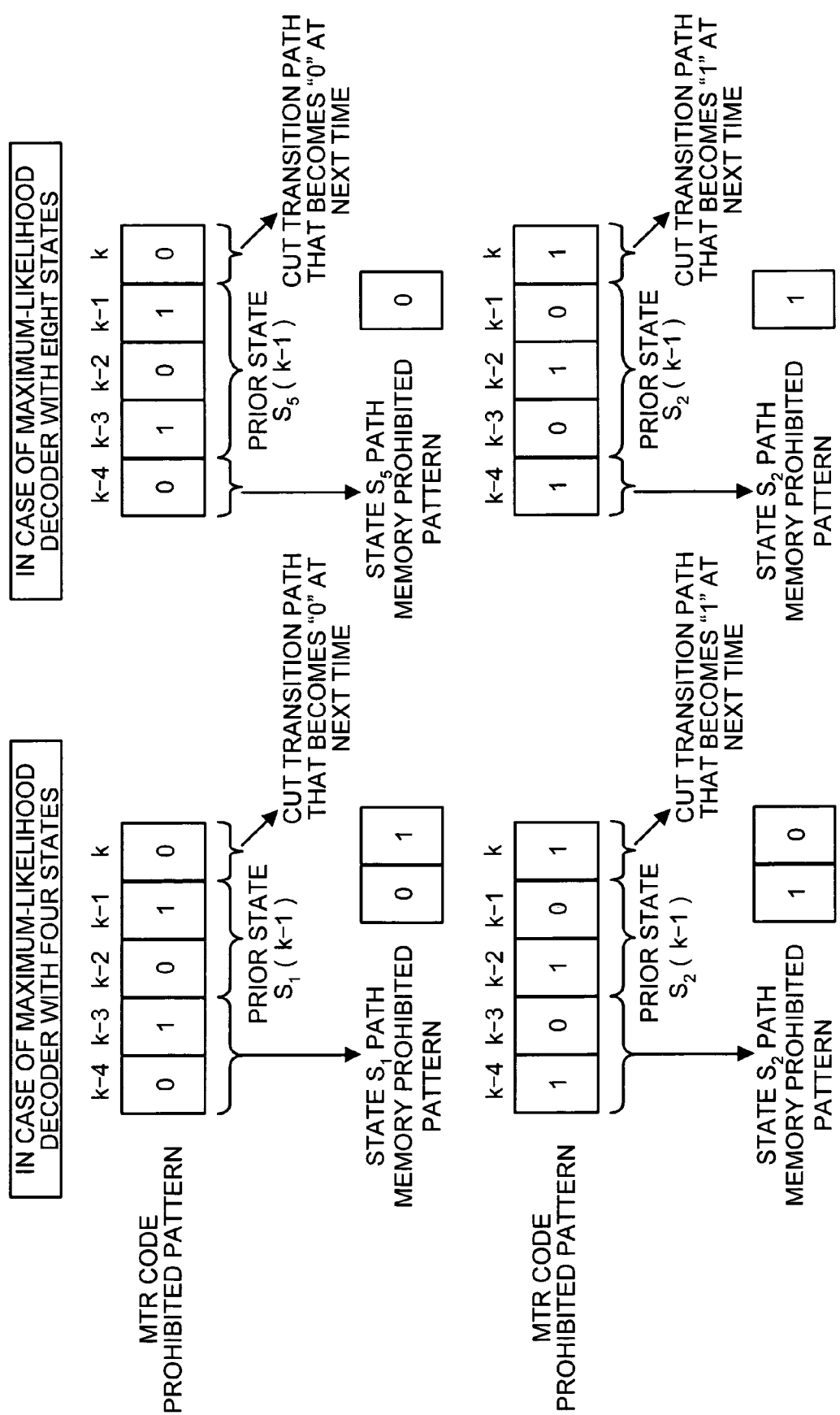
FIG. 5 is a diagram for explaining rules for generation of prohibited patterns.

FIG. 5 is a diagram for explaining rules for generation of prohibited patterns. In a maximum-likelihood decoder having four states, when a prohibited pattern of the MTR code is "01010", bits of a prior state are "01" and a bit at the next time is "0". Thus, a prohibited pattern of a path memory is "01".

In the maximum-likelihood decoder having four states, when a prohibited pattern of the MTR code is "10101", bits of a prior state are "10" and a bit at the next time is "1". Thus, a prohibited pattern of the path memory is "10".

An example of a maximum-likelihood decoder having eight states shown in FIG. 1 is also shown in FIG. 5. In the maximum-likelihood decoder having eight states, when a prohibited pattern of the MTR code is "01010", bits of a prior state are "101" and a bit at the next time is "0". Thus, a prohibited pattern of a path memory is "0".

In the maximum-likelihood decoder having eight states, when a prohibited pattern of the MTR code is "10101", bits of a prior state are "010" and a bit at the next time is "1". Thus, a prohibited pattern of the path memory is "1".

In the above explanation, the prohibited pattern of the MTR code is "01010" or "10101" and the number of states is four or eight. A prohibited pattern length of a path memory and a state in which a prohibited path is detected change according to a prohibited pattern of the MTR code and the number of states. Thus, the prohibited pattern length and the state are appropriately selected according to a prohibited pattern of the MTR code and the number of states.

As described above, according to the first embodiment, when a path at time k is selected, the path memory 12 stores information concerning a selection history of paths selected at time before time (k−(a constraint length of a code)+1). The prohibited-path detecting unit 14 detects, based on the information stored in the path memory 12 and information on a state at a transition source at the time when a state transitions from time k−1 to time k, a path that should be excluded from objects of selection of a path. Thus, it is possible to efficiently delete a path that does not satisfy a predetermined limitation to gain a large gain without increasing a constraint length of a code.

Furthermore, according to the first embodiment, the prohibited-path detecting unit 14 performs coincidence judgment for bits between a bit string in the information stored in the path memory 12 and a specific bit string to detect, based on a result of the coincidence judgment, a path that should be excluded from objects of selection of a path. Thus, there is an effect that it is possible to efficiently detect the path that should be excluded.

Moreover, according to the first embodiment, the specific bit string is a bit string in which bits consecutively reverse like "1010..." or "0101...". Thus, it is possible to efficiently limit the number of consecutive transitions of a bit string.

Furthermore, according to the first embodiment, deletion processing for a path at the time when the MTR code for limiting the number of consecutive transitions is used is explained. However, it is also possible to limit a flux reversal interval in a Run Length Limited (RLL) code for limiting a flux reversal interval. According to a second embodiment of the present invention, a flux reversal interval is limited in the RLL code.

In the above explanation, an 8/9(0,4) RLL code is used. In the 8/9(0,4) RLL code, in Non Return to Zero Inverse (NRZI) modulation in which flux reversal is represented by "1", the number of "0"s (a run length) between bits "1" and "1" is limited to be four or less. In this case, in a decoder output, the number of consecutive bits "0" and "1" is limited to be five or less.

A functional constitution of a maximum-likelihood decoder is substantially the same as that explained with reference to FIG. 2. A function of the prohibited-path detecting unit 14 is different from that according to the first embodiment. Thus, according to the second embodiment, the function of the prohibited-path detecting unit 14 is explained. Explanations of the other functional units having functions same as those according to the first embodiment are omitted.

Figure 6:
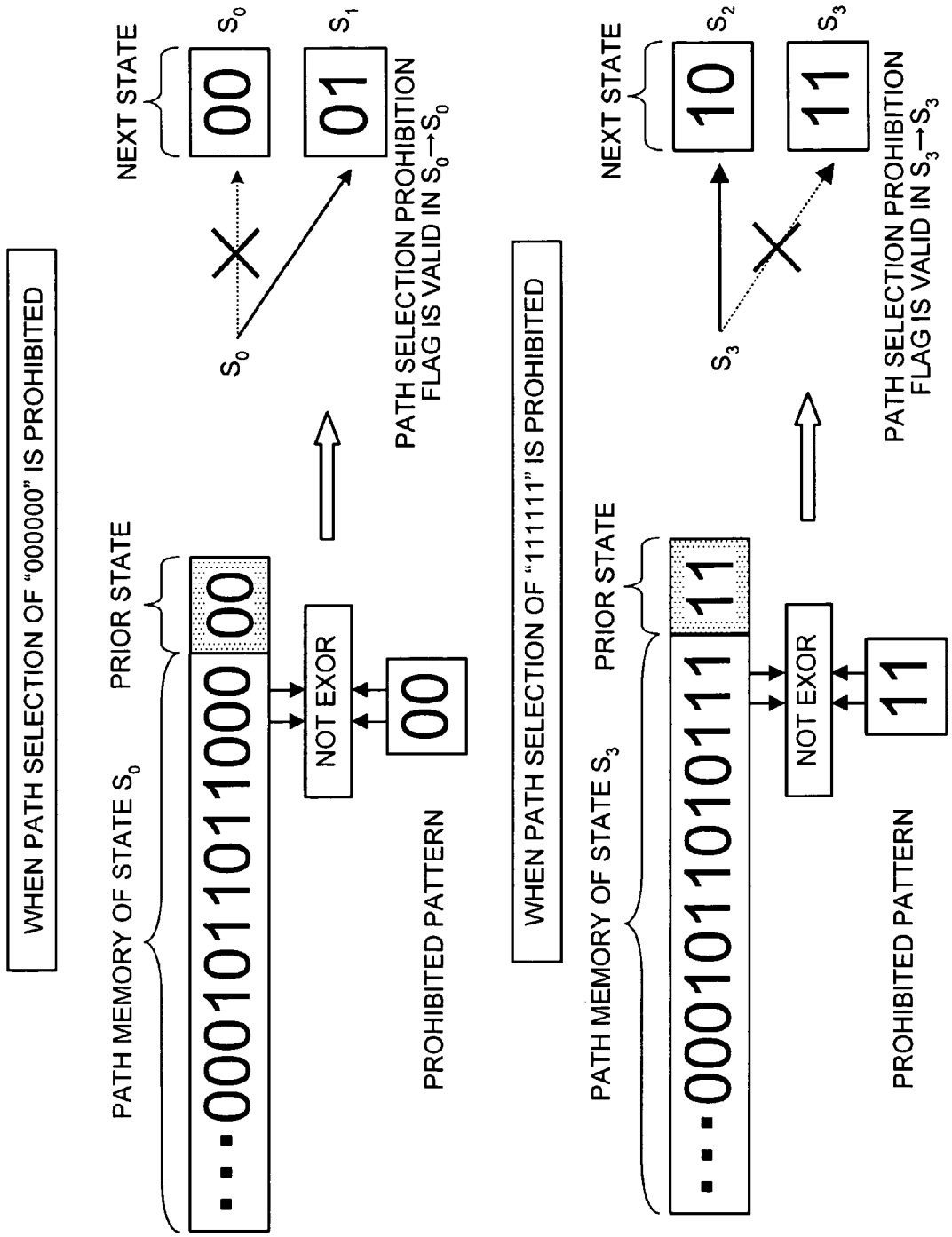
FIG. 6 is a diagram for explaining prohibited path detection processing according to a second embodiment of the present invention.

FIG. 6 is a diagram for explaining prohibited path detection processing according to the second embodiment. The prohibited-path detecting unit 14 according to the second embodiment judges, for each bit, whether a value stored in the path memory 12 and each value of a prohibited pattern coincide with each other. It is possible to execute this coincidence judgment by calculating negation of exclusive OR (not EXOR) for each bit.

When a bit string formed by a prohibited pattern, a prior state, and the next state is a six-consecutive bit string "000000" or "111111", to prohibit selection of a transition path to the next state in which the six-consecutive bit string is caused (from the state $S_0$ to the state $S_0$ or from the state $S_3$ to the state $S_3$), the prohibited-path detecting unit 14 validates a path-selection prohibiting flag corresponding to the transition path.

The ACS calculating unit 11 acquires information indicating whether the path-selection prohibiting flag is valid from the prohibited-path detecting unit 14. When there is a path for which the path-selection prohibiting flag is valid, the ACS calculating unit 11 excludes the path from objects of selection of a path in an ACS operation.

As described above, according to the second embodiment, the prohibited-path detecting unit 14 performs coincidence judgment for bits between a bit string in the information stored in the path memory 12 and a bit string in which identical bits are consecutive to detect, based on a result of the coincidence judgment, a path that should be excluded from objects of selection of a path. Thus, it is possible to efficiently limit the number of consecutive identical bits of a bit string in a decoder output.

Furthermore, according to the second embodiment, the number of "0"s (a run length) between bits "1" and "1" is limited in the RLL code. However, it is possible to take into account limitation of a run length in the MTR code in the same manner.

By using the coincidence judgment method for a prohibited path explained in the first and the second embodiments, it is possible to easily constitute a maximum-likelihood decoder to exclude an arbitrary bit string pattern other than a bit string in which bits consecutively transition and a bit string in which identical bits are consecutive. Moreover, it is also possible to set a plurality of conditions for a bit string pattern to be excluded.

According to the first and the second embodiments, coincidence detection for a prohibited path is performed. However, it is also possible that the number of transitions of a bit string specifying a path stored in a path memory is counted and, when the number of transitions reaches the prohibited number of transitions, a transition path at the next time is deleted. According to a third embodiment of the present invention, the number of transitions of a bit string specifying a path stored in a path memory is counted.

Figure 7:
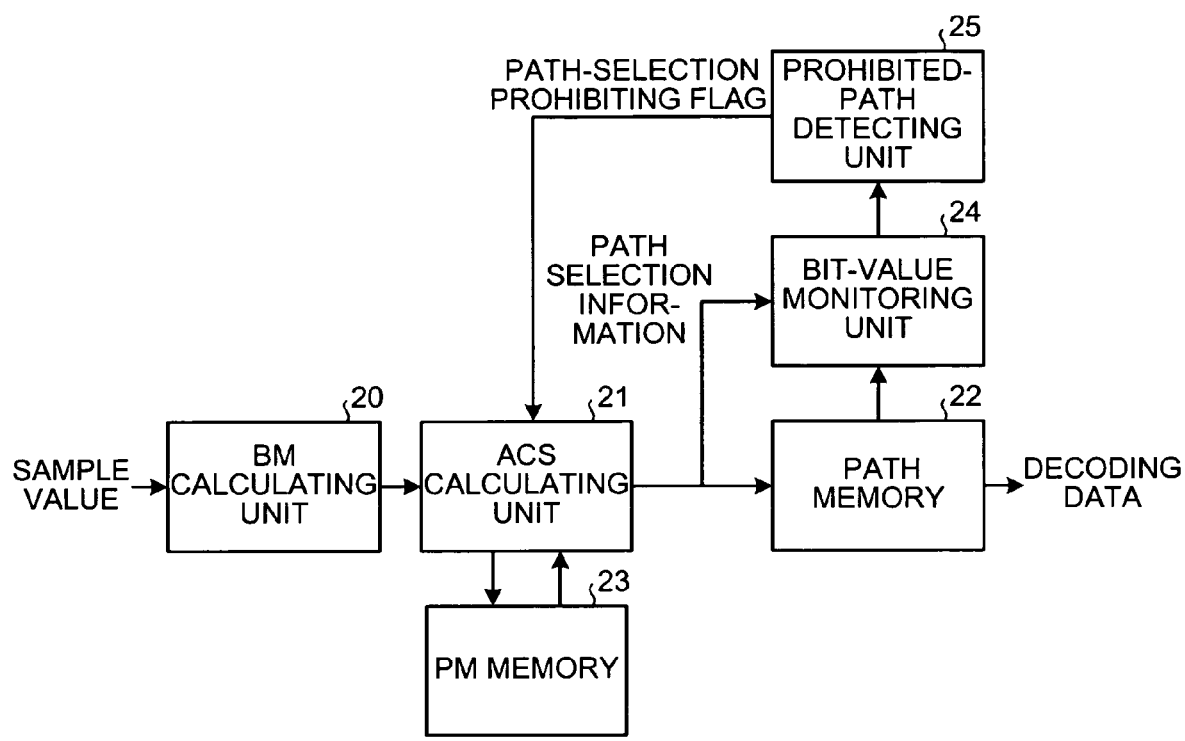
FIG. 7 is a diagram of a functional constitution of a maximum-likelihood decoder according to a third embodiment of the present invention.

FIG. 7 is a diagram of a functional constitution of a maximum-likelihood decoder according to the third embodiment. The maximum-likelihood decoder includes a BM calculating unit 20, an ACS calculating unit 21, a path memory 22, a PM memory 23, a bit-value monitoring unit 24, and a prohibited-path detecting unit 25.

The BM calculating unit 20 calculates a branch metric with respect to a sample value (a signal obtained by adding noise of a channel to a decoder input). Specifically, the BM calculating unit 20 calculates, according to Equation (1), a branch metric $BM_{mn}$ at the time when a state transitions from the state $S_m$ to the state $S_n$ at time k.

The ACS calculating unit 21 performs an ACS operation for adding up a path metric in a state at time k−1 and a branch metric at the time when a state transitions from time k−1 to time k and selecting a path through comparison of magnitudes of path metrics in the state at time k obtained by the addition.

The ACS calculating unit 21 acquires information indicating whether a path-selection prohibiting flag explained later is valid from the prohibited-path detecting unit 25 and, when there is a path for which the path-selection prohibiting flag is valid, excludes the path from objects of selection of a path.

When a path is selected, the ACS calculating unit 21 copies content of a path memory corresponding to a state at a transition source of a state transition specified by the path to a path memory corresponding to a state at a transition destination. The ACS calculating unit 21 stores a value of a first bit of bits representing the state at the transition source in the path memory corresponding to the state at the transition destination.

The path memory 22 stores information on a selected path. A survival path is retrieved based on the information stored in the path memory 12 and read out as decoding data.

The PM memory 23 stores a path metric calculated by the ACS calculating unit 21. The path metric stored by the PM memory 23 is read out by the ACS calculating unit 21 when the ACS operation is executed at the next time k+1.

The bit-value monitoring unit 24 performs processing for monitoring latest bits stored in the path memory 22 and bits at time immediately preceding the latest bits and counting the number of transitions of bit values in a bit string stored in the path memory 22.

Figure 8:
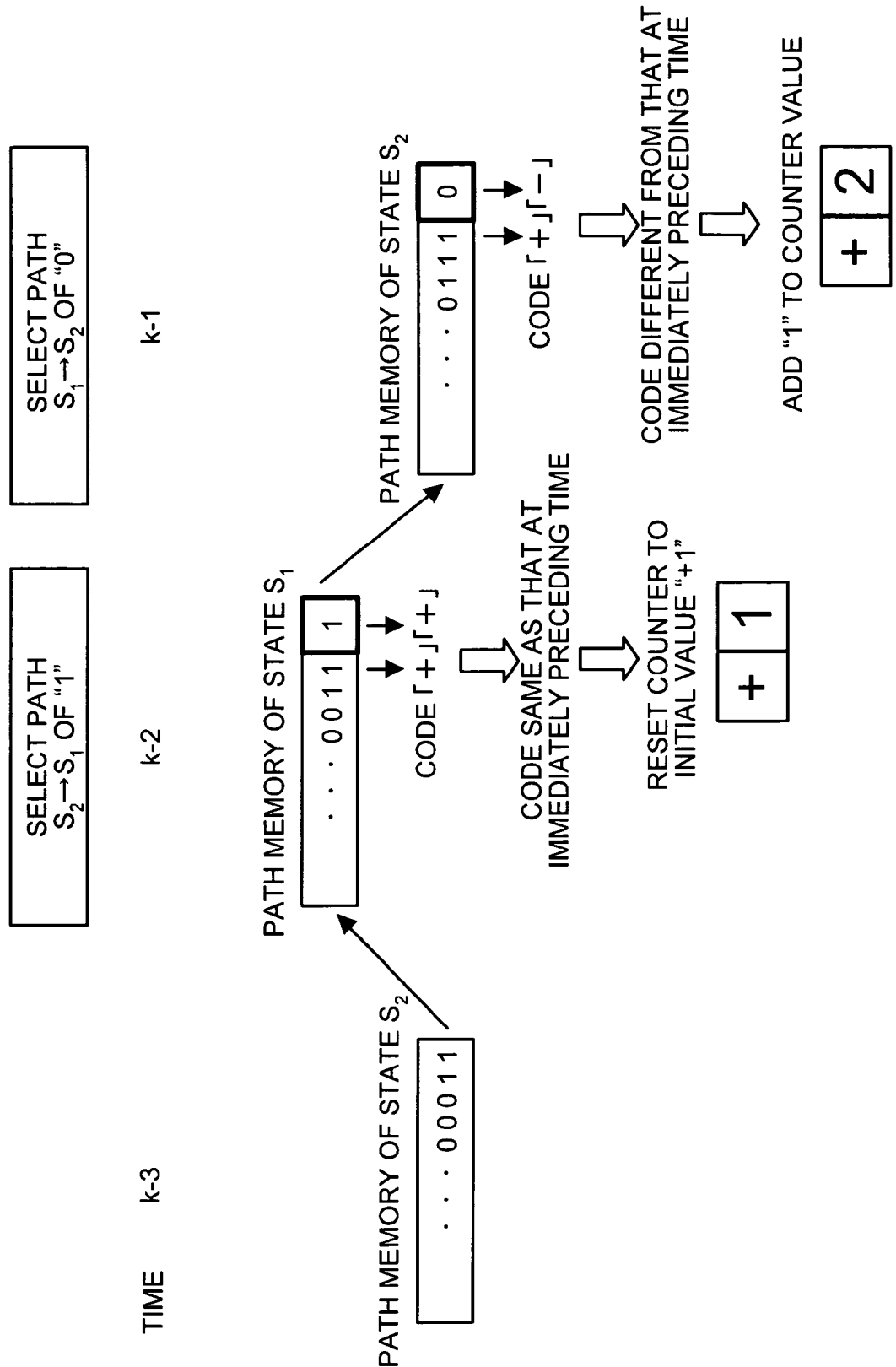
FIG. 8 is a diagram for explaining number of transitions counting processing for bit values.

FIG. 8 is a diagram for explaining number of transitions counting processing for bit values. Content of a path memory at the time when a state transitions according to the state transition table of four states shown in FIG. 4 is shown in FIG. 8. The state $S_1$ corresponds to "01" and the state $S_2$ corresponds to "10". Counters that store the number of transitions of bits are provided for the respective states.

When a state transitions from the state $S_m$ (m=0, 1, 2, 3) to the state $S_n$ (n=0, 1, 2, 3) according to the ACS operation, the bit-value monitoring unit 24 copies a value with a sign held by the counter for the state $S_m$ at a transition source to the counter for the state $S_n$ at a transition destination. The value with a sign held by the counter is explained in detail later.

Subsequently, the bit-value monitoring unit 24 checks whether a sign of a latest bit stored in the path memory 22 of the state $S_n$ at the present time is the same as a sign of a bit at immediately preceding time. A sign of a bit is defined as "+" when the bit is "1" and defined as "−" when the bit is "0".

When the latest bit stored in the path memory of the state $S_n$ is "1" and a sign of the bit is the same as a sign of the bit at immediately preceding time, the bit-value monitoring unit 24 resets a value of the counter for the state $S_n$ that counts the number of consecutive transitions to an initial value "+1".

When the latest bit stored in the path memory of the state $S_n$ is "0" and a sign of the bit is the same as a sign of the bit at immediately preceding time, the bit-value monitoring unit 24 resets the counter for the state $S_n$ that counts the number of consecutive transitions to an initial value "−1".

When the latest bit stored in the path memory of the state $S_n$ is "0" and a sign of the bit is different from a sign of the bit at immediately preceding time, the bit-value monitoring unit 24 stores a value obtained by adding "1" to a value of the counter for the state $S_n$ as a new count value.

When the latest bit stored in the path memory of the state $S_n$ is "1" and a sign of the bit is different from a sign of the bit at immediately preceding time, the bit-value monitoring unit 24 stores a value obtained by subtracting "1" from a value of the counter for the state $S_n$ as a new count value.

In the example shown in FIG. 8, at time k−2, a transition path from the state $S_2$ to the state $S_1$ is selected according to the ACS operation for the state $S_1$. Information held by the path memory of the state $S_2$ at time k−3 is copied to the path memory of the state $S_1$ and information "1" of a first bit of bits "10" representing the state $S_2$ is added to the path memory.

In this case, the bit-value monitoring unit 24 copies a value with a sign (not shown) held by a counter for the state $S_2$ at a transition source to a counter for the state $S_1$ at a transition destination. A latest bit stored in the path memory of the state $S_1$ at time k−2 is "1" and a bit at immediately preceding time is "1". Thus, a sign of the latest bit is the same as a sign of the bit at immediately preceding time. The bit-value monitoring unit 24 resets the counter for the state $S_1$ to an initial value "+1".

At time k−1, a transition path from the state $S_1$ to the state $S_2$ is selected according to the ACS operation for the state $S_2$. Information held by the path memory of the state $S_1$ at time k−2 is copied to the path memory of the state $S_2$ and information "0" of a first bit of bits "01" representing the state $S_1$ is added to the path memory.

In this case, the bit-value monitoring unit 24 copies a value with a sign "+1" held by a counter for the state $S_1$ at a transition source to a counter for the state $S_2$ at a transition destination. A latest bit stored in the path memory of the state $S_2$ at time k−1 is "0" and a bit at immediately preceding time is "1". Thus, a sign of the latest bit is different from a sign of the bit at immediately preceding time. The bit-value monitoring unit 24 stores a value "+2" obtained by adding "1" to the counter value of the state $S_2$ as a new counter value of the state $S_2$.

Referring back to FIG. 7, the prohibited-path detecting unit 25 acquires information on a count value counted by the bit-value monitoring unit 24. When a count value of the state $S_2$ is "+2", the prohibited-path detecting unit 25 validates a path-selection prohibiting flag for a transition path from the state $S_2$ to the state $S_1$ and excludes the transition path from candidates of selection of a transition path in the ACS operation at time k. This makes it possible to prevent four consecutive transitions "10101" from occurring.

When a count value of the state $S_1$ is "−2", the prohibited-path detecting unit 25 validates a path-selection prohibiting flag for a transition path from the state $S_1$ to the state $S_2$ and excludes the transition path from candidates of selection of a transition path in the ACS operation at time k. This makes it possible to prevent four consecutive transitions "01010" from occurring.

When a count value is a value other than "+2" or "−2", the prohibited-path detecting unit 25 invalidates the path-selection prohibiting flag.

Figure 9:
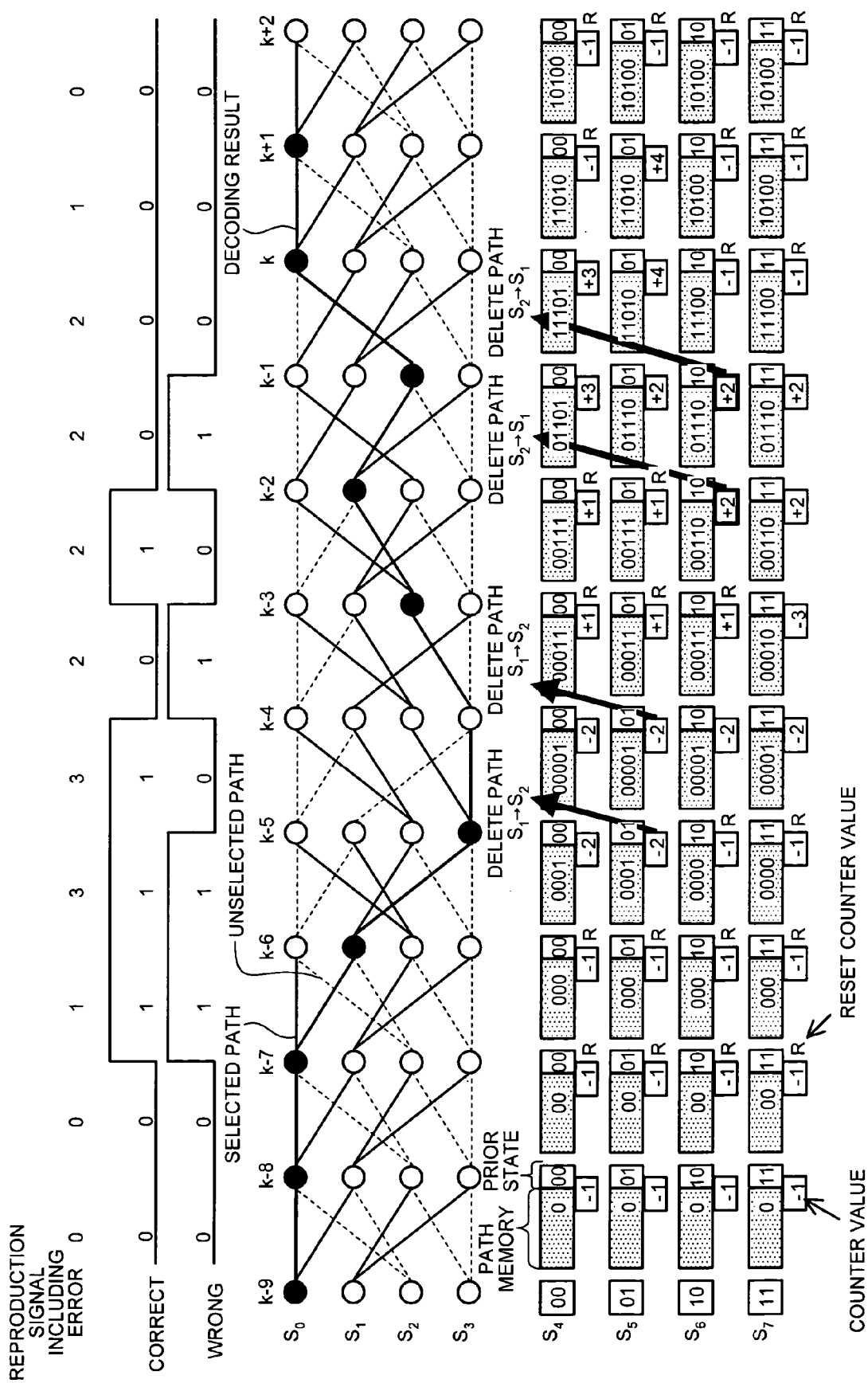
FIG. 9 is a diagram for explaining Viterbi decoding processing realized using the number of transitions counting processing for a bit value.

FIG. 9 is a diagram for explaining Viterbi decoding processing that is realized by using the number of transitions count processing for bit values. In a state shown in FIG. 9, when a reproduction signal including an error is inputted to a maximum-likelihood decoder, the reproduction signal is appropriately decoded to a correct signal by deleting a path in which the four consecutive transitions occur.

As shown in FIG. 9, when a count value of the state $S_1$ is "−2", the ACS calculating unit 21 deletes a transition path from the state $S_1$ to the state $S_2$ to prevent four consecutive transitions "01010" from occurring.

When a count value of the state $S_2$ is "+2", the ACS calculating unit 21 deletes a transition path from the state $S_2$ to the state $S_1$ to prevent the four consecutive transitions "10101" from occurring.

As described above, according to the third embodiment, the bit-value monitoring unit 24 detects a path that should be excluded from objects of selection of a path by counting bits in a bit string in information stored in the path memory 22. Thus, it is possible to efficiently detect the path that should be excluded.

Furthermore, according to the third embodiment, the bit-value monitoring unit 24 detects a path that should be excluded from objects of selection of a path by counting bits that consecutively reverse like "1010 . . ." or "0101 . . ." in a bit string. Thus, it is possible to efficiently limit the number of consecutive transitions in a bit string.

In the explanation according to the third embodiment, a path is deleted by counting the number of transitions of bits with respect to the MTR code that limits the number of consecutive transitions. In the RLL code that limits a flux reversal interval, it is also possible to limit a flux reversal interval by counting the number of consecutive bits to delete a path. Thus, according to a fourth embodiment of the present invention, in the RLL code, a flux reversal interval is limited by counting the number of consecutive bits to delete a path.

A functional constitution of a maximum-likelihood decoder is substantially the same as that explained with reference to FIG. 7. Functions of the bit-value monitoring unit 24 and the prohibited-path detecting unit 25 are different from those according to the third embodiment. Thus, according to the fourth embodiment, the functions of the bit-value monitoring unit 24 and the prohibited-path detecting unit 25 are explained. Explanations of the other functional units having functions same as those according to the third embodiment are omitted.

The bit-value monitoring unit 24 according to the fourth embodiment performs processing for monitoring a latest bit stored in the path memory 22 and a bit at immediately preceding time and counting the number of consecutive bit values in a bit string stored in the path memory 22.

Figure 10:
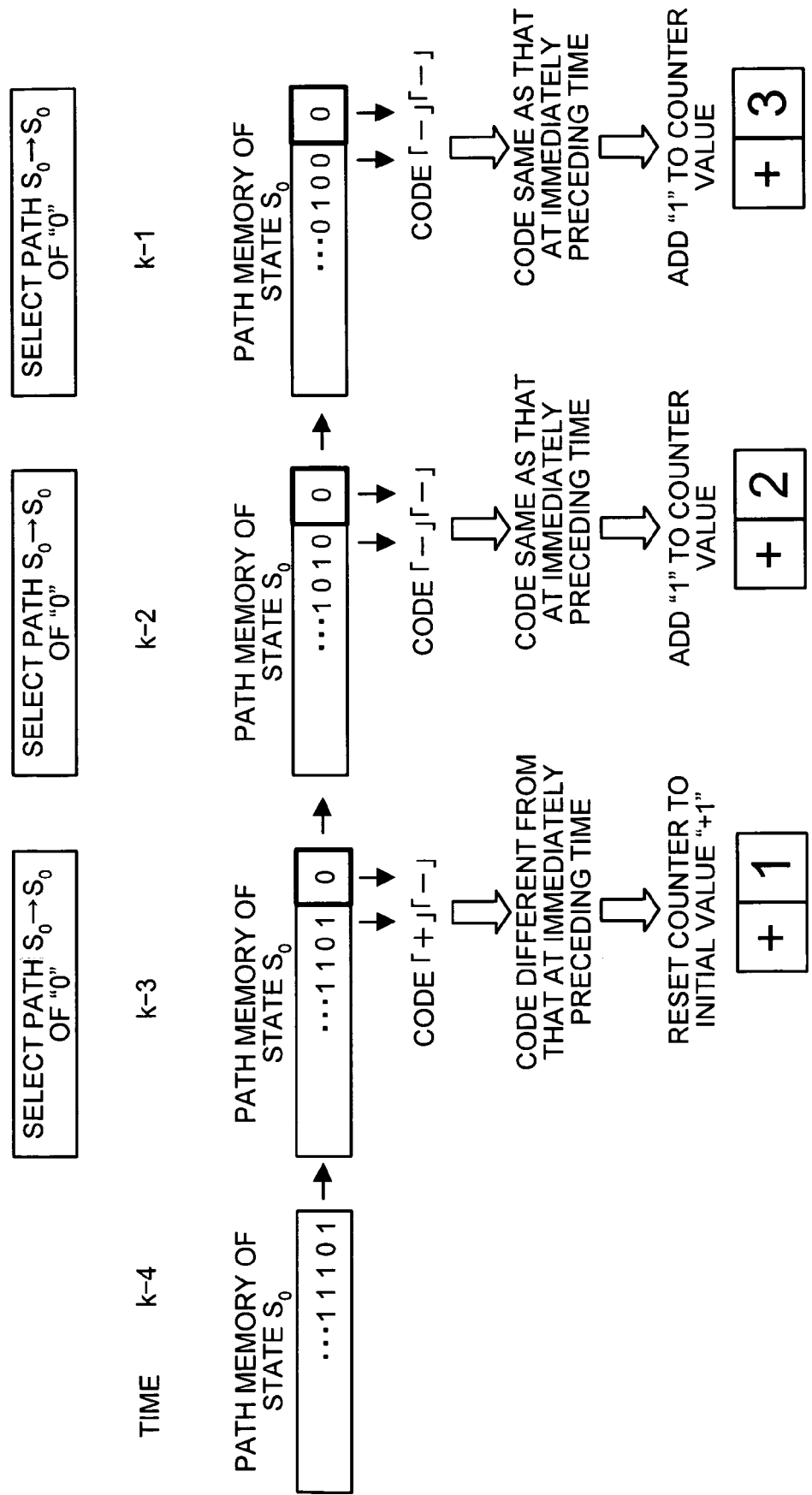
FIG. 10 is a diagram for explaining processing for counting the number of consecutive bit values according to a fourth embodiment of the present invention.

FIG. 10 is a diagram for explaining processing for counting the number of consecutive bit values according to the fourth embodiment. Content of a path memory at the time when a state transitions according to the state transition table of four states shown in FIG. 4 is shown in FIG. 10. A state $S_0$ corresponds to "00".

When a state transitions from the state $S_m$ (m=0, 1, 2, 3) to the state $S_n$ (n=0, 1, 2, 3) according to the ACS operation, the bit-value monitoring unit 24 copies a value with a sign held by a counter for the state $S_m$ at a transition source to a counter for the state $S_n$ at a transition destination. The value with a sign held by the counter is described in detail later.

Subsequently, the bit-value monitoring unit 24 checks whether a sign of a latest bit stored in the path memory 22 of the state $S_n$ at the present time is the same as a sign of a bit at immediately preceding time. A sign of a bit is defined as "+" when the bit is "1" and defined as "−" when the bit is "0".

When the latest bit stored in the path memory of the state $S_n$ is "0 and a sign of the bit is different from a sign of the bit at immediately preceding time, the bit-value monitoring unit 24 resets a value of the counter for the state $S_n$ that counts the number of consecutive bits to an initial value "+1".

When the latest bit stored in the path memory of the state $S_n$ is "1" and a sign of the bit is different from a sign of the bit at immediately preceding time, the bit-value monitoring unit 24 resets the counter for the state $S_n$ that counts the number of consecutive bits to an initial value "−1".

When the latest bit stored in the path memory of the state $S_n$ is "0" and a sign of the bit is the same as a sign of the bit at immediately preceding time, the bit-value monitoring unit 24 stores a value obtained by adding "1" to a value of the counter for the state $S_n$ as a new count value.

When the latest bit stored in the path memory of the state $S_n$ is "1" and a sign of the bit is the same as a sign of the bit at immediately preceding time, the bit-value monitoring unit 24 stores a value obtained by subtracting "1" from a value of the counter for the state $S_n$ as a new count value.

In the example shown in FIG. 10, at time k−3, a transition path from the state $S_0$ to the state $S_0$ is selected according to the ACS operation for the state $S_0$. In a path memory of the state $S_0$, information "0" of a first bit of bits "00" representing the state $S_0$ is added to information held by the path memory of the state $S_0$ at time k−4.

In this case, a latest bit stored in the path memory of the state $S_0$ is "0" and a bit at immediately preceding time is "1".

Thus, a sign of the latest bit is different from a sign of the bit at immediately preceding time. The bit-value monitoring unit 24 resets a counter for the state $S_0$ to an initial value "+".

At time k−2, a transition path from the state $S_0$ to the state $S_0$ is selected according to the ACS operation for the state $S_0$. In the path memory of the state $S_0$, the information "0" of the first bit of the bits "00" representing the state $S_0$ is added to information held by the path memory of the state $S_0$ at time k−3.

In this case, the latest bit stored in the path memory of the state $S_0$ is "0" and the bit at immediately preceding time is "0". Thus, a sign of the latest bit is the same as a sign of the bit at immediately preceding time. The bit-value monitoring unit 24 stores a value "+2" obtained by adding "1" to a counter value of the state $S_0$ as a new counter value of the state $S_0$.

At time k−1, a transition path from the state $S_0$ to the state $S_0$ is selected according to the ACS operation for the state $S_0$. In the path memory of the state $S_0$, the information "0" of the first bit of the bits "00" representing the state $S_0$ is added to information held by the path memory of the state $S_0$ at time k−2.

In this case, the latest bit stored in the path memory of the state $S_0$ is "0" and the bit at immediately preceding time is "0". Thus, a sign of the latest bit is the same as a sign of the bit at immediately preceding time. The bit-value monitoring unit 24 stores a value "+3" obtained by adding "1" to a counter value of the state $S_0$ as a new counter value of the state $S_0$.

The prohibited-path detecting unit 25 according to the fourth embodiment acquires information on a count value counted by the bit-value monitoring unit 24. When a count value of the state $S_0$ is "+3", the prohibited-path detecting unit 25 validates a path-selection prohibiting flag for a transition path from the state $S_0$ to the state $S_0$ and excludes the transition path from candidates of selection of a transition path in the ACS operation at time k. Consequently, it is possible to prevent a six-consecutive bit string "000000" from occurring.

When a count value of the state S3 is "−3", the prohibited-path detecting unit 25 validates a path-selection prohibiting flag for a transition path from the state S3 to the state S3 and excludes the transition path from candidates of selection of a transition path in the ACS operation at time k. Consequently, it is possible to prevent a six-consecutive bit string "111111" from occurring.

When a count value is a value other than "+3" or "−3", the prohibited-path detecting unit 25 invalidates a path-selection prohibiting flag.

As described above, according to the fourth embodiment, the bit-value monitoring unit 24 detects a path that should be excluded from objects of selection of a path by counting consecutive identical bits like "111 . . ." or "000 . . ." in a bit string. This makes it possible to efficiently limit the number of consecutive identical bits in the bit string.

Furthermore, according to the fourth embodiment, the number of "0"s (a run length) between bits "1" and "1" is limited in the RLL code. However, it is also possible to limit the run length in the MTR code in the same manner. It is also possible to set a plurality of conditions for a bit string pattern to be excluded.

In the explanations according to the first to the fourth embodiments, the present invention is applied to the maximum-likelihood decoder that uses the Viterbi decoding method. However, it is possible to apply the present invention to any maximum-likelihood decoder in the same manner as long as the maximum-likelihood decoder uses a path memory or a memory that has a function equivalent to that of the path memory. For example, it is possible to apply the present invention to a maximum-likelihood decoder that uses a Soft Output Viterbi Algorithm (SOVA) that is capable of performing soft input and soft output.

In the explanations according to the first to the fourth embodiments, a path is deleted in a maximum-likelihood decoder, a PR constraint length of which is equal to or smaller than a limit length such as a consecutive transition limit length or a run length limit length. However, since the number of code words to be objects of comparison of path metrics decreases because of the deletion of the path, the reduction in the number of code words may be prevented to minimize a loss of a gain.

Figure 30:
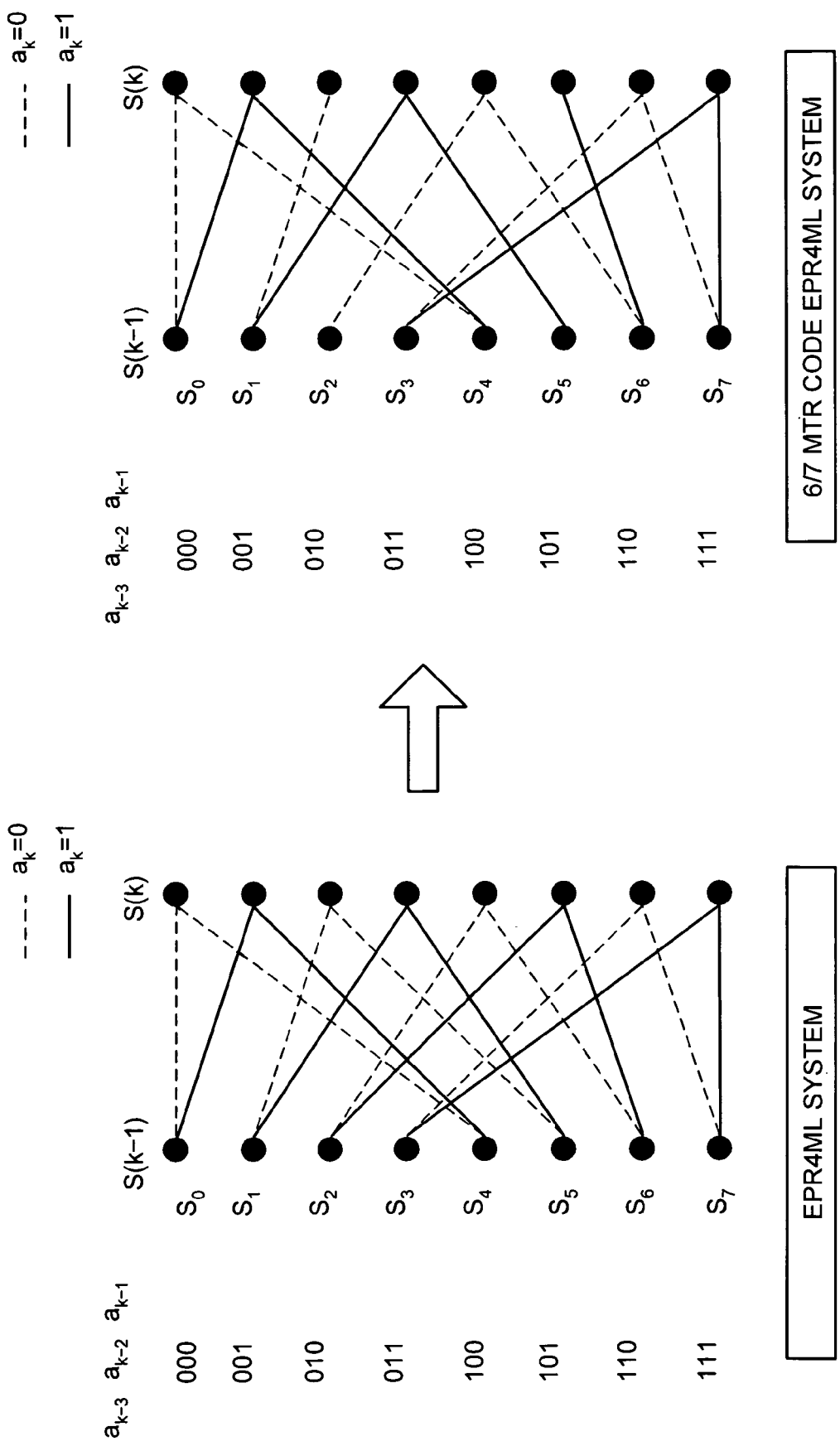
FIG. 30 is a diagram for explaining a 6/7 MTR encoding EPR4ML system.

In the static path deletion processing shown in FIG. 30, comparison of path metrics is performed for code words of all paths other than a deleted path to execute maximum likelihood decoding processing. However, in the dynamic path deletion processing described in the first to the fourth embodiments, since deletion processing for a path is performed at a point in the past, the number of code words to be objects of comparison of path metrics decreases. Therefor, maximum likelihood decoding is realized for a condition of a PR constraint length but is not realized for a condition of a limit length. As a result, a loss of a gain occurs.

Thus, according to a fifth embodiment of the present invention, the number of code words to be object of comparison of path metrics is prevented from decreasing to minimize a loss of a gain.

Figure 11:
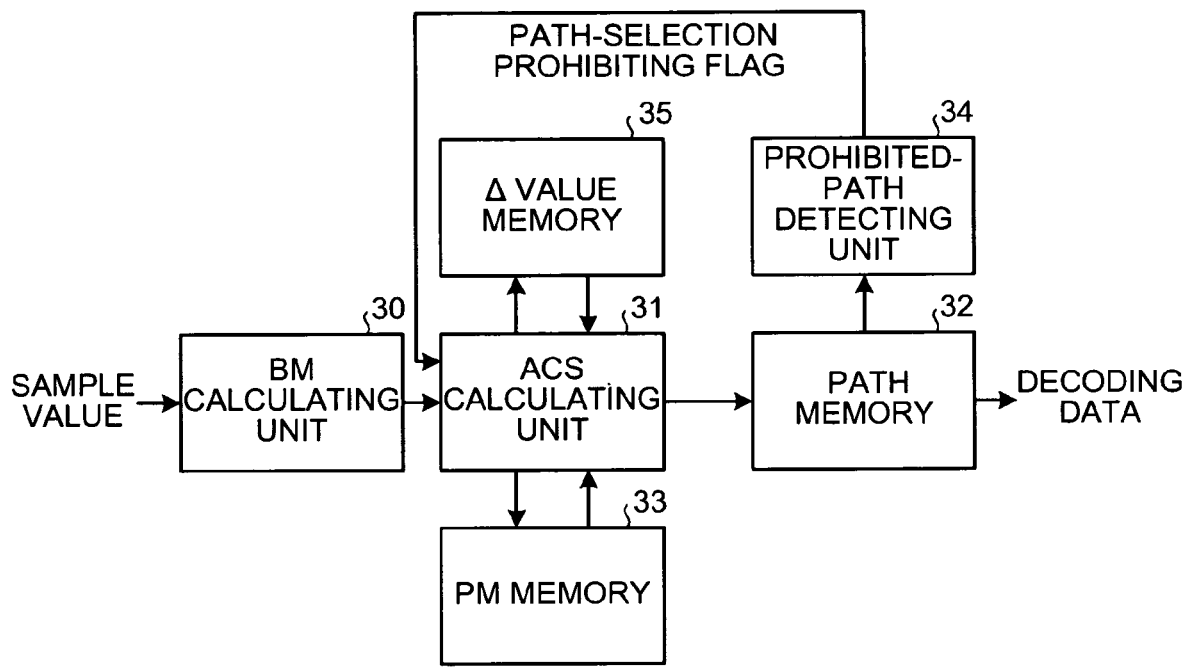
FIG. 11 is a diagram of a functional constitution of a maximum-likelihood decoder according to a fifth embodiment of the present invention.

FIG. 11 is a diagram of a functional constitution of a maximum-likelihood decoder according to the fifth embodiment. As shown in FIG. 11, this maximum-likelihood decoder includes a BM calculating unit 30, an ACS calculating unit 31, a path memory 32, a PM memory 33, a prohibited-path detecting unit 34, and a Δ value memory 35.

The BM calculating unit 30 calculates a branch metric with respect to a sample value (a signal obtained by adding noise of a channel to a decoder input). Specifically, the BM calculating unit 30 calculates, according to Equation (1), a branch metric $BM_{mn}$ at the time when a state transitions from the state $S_m$ to the state $S_n$ at time k.

The ACS calculating unit 31 performs an ACS operation for adding up a path metric in a state at time k−1 and a branch metric at the time when a state transitions from time k−1 to time k and selecting a path through comparison of magnitudes of path metrics in the state at time k obtained by the addition.

Figure 12:
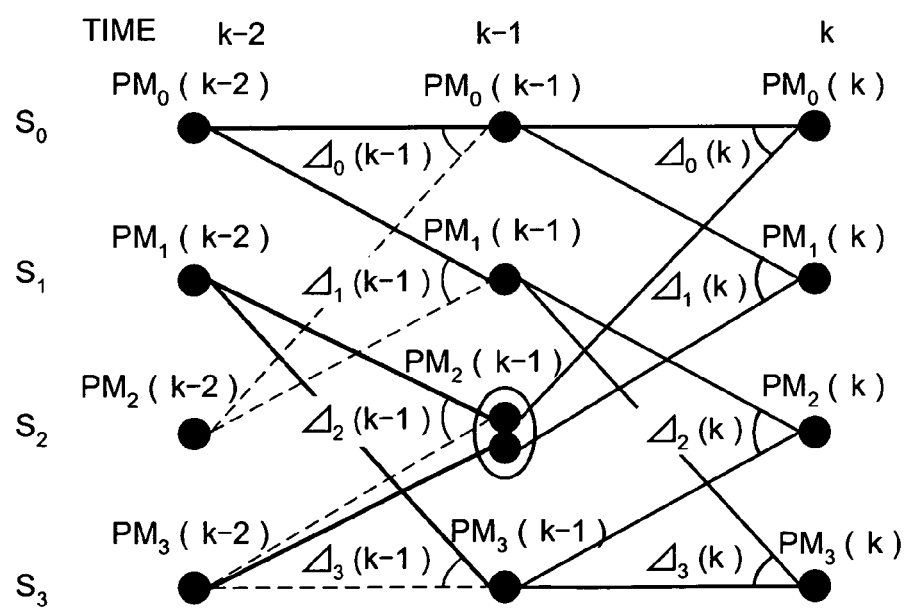
FIG. 12 is a diagram of trellis diagrams in ACS calculating process according to the fifth embodiment.

FIG. 12 is a diagram of trellis diagrams in ACS calculating process according to the fifth embodiment. FIG. 13 is a diagram for explaining the ACS calculating process according to the fifth embodiment. In the trellis diagrams shown in FIG. 12, a state transitions according to the state transition table of four states shown in FIG. 4.

The ACS calculating unit 31 calculates, using Equations 2 and 3, the path metrics $PM_n^0(k)$ and $PM_n^1(k)$ of the two paths that transition from the state $S_m$ and a state $S_{m'}$ to the state $S_n$ at time k.

The ACS calculating unit 31 also calculates an absolute value of a difference between the path metrics $PM_n^0(k)$ and $PM_n^1(k)$ of the two paths as $$\Delta_n(k) = |PM_n^0(k) - PM_n^1(k)| \qquad (8)$$

However, the ACS calculating unit 31 acquires information indicating whether a path-selection prohibiting flag explained later is valid from the prohibited-path detecting unit 34. When there is a path for which the path-selection prohibiting flag is valid, the ACS calculating unit 31 excludes the path from objects of selection of a path.

In this case, if a path that transitions from the state Sm' to the state Sn is excluded from objects of selection of a path, the ACS calculating unit 31 calculates, according to following equations, the path metrics $PM_n^0(k)$ and $PM_n^1(k)$ of the two paths that transition from the state $S_m$ and a state $S_{m'}$ to the state $S_n$.

$$PM_n^0(k) = PM_m(k-1) + BM_{mn}(k) \qquad (9)$$

$$PM_n^1(k) = PM_{m'}(k-1) + \Delta_{m'}(k-1) + BM_{m'n}(k) \qquad (10)$$

where $\Delta_{m'}(k-1)$ is an absolute value of a difference between path metrics $PM_{m'}^0(k-2)$ and $PM_{m'}^1(k-2)$ of two transition paths at the time when a state transitions from two states at time k−2 to the state $S_{m'}$ at time k−1. The absolute value $\Delta_{m'}(k-1)$ is represented as $$\Delta_{m'}(k-1) = |PM_{m'}^0(k-1) - PM_{m'}^1(k-1)| \qquad (11)$$

The ACS calculating unit 31 compares magnitudes of the path metrics $PM_n^0(k)$ and $PM_n^1(k)$ of the two paths and selects a path based on Equation (4). The ACS calculating unit 31 changes a path selected at time k−3 leading to a path that should be excluded from objects of selection of a path detected by the prohibited-path detecting unit 34. By changing the path selected at time k−3, the ACS calculating unit 31 includes the path that should be excluded from objects of selection of a path in the objects of selection of a path and executes selection of a path.

When a path excluded from objects of selection of a path is selected, in updating the path memory 32, in the path memory 32 of a state at a transition source of the excluded path, the ACS calculating unit 31 reverses a bit value indicating a transition path selected at time k−3.

As shown in FIGS. 12 and 13, a transition path from the state $S_2$ to the state $S_1$ that causes the four consecutive transitions "10101" is excluded from time k−1 to time k.

As shown in FIG. 13, when a transition path from the state $S_2$ at time k−1 to the state $S_0$ at time k is selected according to the ACS operation in the state $S_0$ at time k, the transition path is not the transition path detected by the prohibited-path detecting unit 34. Thus, the ACS calculating unit 31 uses content of a path memory of the state $S_2$ at time k−1 without changing the content at the time of update of the path memory of the state $S_0$ at time k.

On the other hand, when a transition path from the state $S_2$ at time k−1 to the state $S_1$ at time k is selected in the ACS operation for the state $S_1$ at time k, the transition path is a transition path selected by the prohibited-path detecting unit 34. Thus, when a path memory of the state $S_1$ at time k is updated, the ACS calculating unit 31 reverses a bit value "0" indicating the transition path selected at time k−3 in content " . . . 110" of a path memory of the state $S_2$ at time k−1.

Referring back to FIG. 11, the path memory 32 stores information on a selected path. A survival path is retrieved based on the information stored in the path memory 32 and read out as decoding data.

The PM memory 33 stores a path metric calculated by the ACS calculating unit 31. The path metric stored by the PM memory 33 is read out by the ACS calculating unit 31 when the ACS operation is executed at the next time k+1.

The prohibited-path detecting unit 34 performs, for each bit, detection of coincidence of values between a specific prohibited pattern and a path memory. When there is a path in which all bits coincide with the prohibited pattern, the prohibited-path detecting unit 34 validates a path-selection prohibiting flag corresponding to the path.

The Δ value memory 35 stores a difference Δn(k) between path metrics calculated by the ACS calculating unit 31 using Equation (8). When a path is deleted, the ACS calculating unit 31 calculates a path metric using Equation (10) with reference to a value stored in the Δ value memory 35.

According to the fifth embodiment, setting of a path-selection prohibiting flag is executed according to the coincidence judgment for a prohibited pattern explained in the first and the second embodiments. However, setting of a path-selection prohibiting flag may be performed by counting the number of bits as explained in the third and the fourth embodiments.

Figure 14:
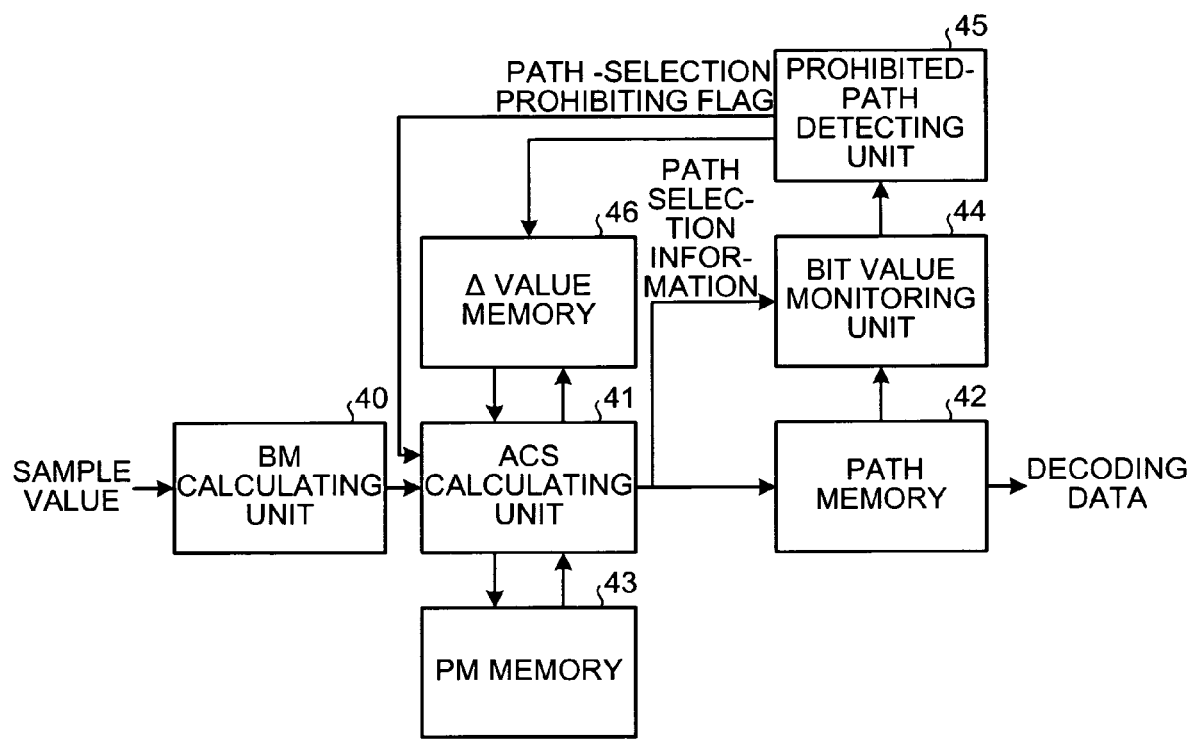
FIG. 14 is a diagram of a functional constitution of a maximum-likelihood decoder according to a modification of the fifth embodiment.

FIG. 14 is a diagram of a functional constitution of a maximum-likelihood decoder according to a modification of the fifth embodiment. The maximum-likelihood decoder includes a BM calculating unit 40, an ACS calculating unit 41, a path memory 42, a PM memory 43, a bit-value monitoring unit 44, a prohibited-path detecting unit 45, and a Δ value memory 46.

The BM calculating unit 40, the path memory 42, the PM memory 43, the bit-value monitoring unit 44, and the prohibited-path detecting unit 45 are the same as the BM calculating unit 20, the path memory 22, the PM memory 23, the bit-value monitoring unit 24, and the prohibited-path detecting unit 25 of the maximum-likelihood decoder explained with reference to FIG. 7.

The ACS calculating unit 41 performs an ACS operation for adding up a path metric in a state at time k−1 and a branch metric at the time when a state transitions from time k−1 to time k and selecting a path through comparison of magnitudes of path metrics in the state at time k obtained by the addition.

The ACS calculating unit 41 acquires information indicating whether a path-selection prohibiting flag is valid from the prohibited-path detecting unit 45. When there is a path for which the path-selection prohibiting flag is valid, the ACS calculating unit 41 excludes the path from objects of selection of a path.

In that case, the ACS calculating unit 41 performs an ACS operation same as that in the ACS calculating unit 31 of the maximum-likelihood decoder explained with reference to FIG. 11. The Δ value memory 46 is a memory that stores a difference between path metrics calculated by the ACS calculating unit 41 using Equation (8).

As described above, according to the fifth embodiment, the ACS calculating unit 31 or the ACS calculating unit 41 changes a path selected in the past leading to a path that should be excluded from objects of selection of a path detected by the prohibited-path detecting unit 34 or the prohibited-path detecting unit 45. By changing the path selected in the past, the ACS calculating unit 31 or the ACS calculating unit 41 includes the path that should be excluded from objects of selection of a path in the objects of selection of a path and executes selection of a path. Thus, it is possible to prevent the number of code words to be candidates of a decoding result from decreasing and minimize a loss of a gain.

In the explanation according to the fifth embodiment, in the maximum-likelihood decoder that performs Viterbi decoding, the number of code words to be objects of comparison of path metrics is prevented from decreasing. However, the number of code words may be prevented from decreasing in a maximum-likelihood decoder that uses the Soft Output Viterbi Algorithm (SOVA). Thus, according to a sixth embodiment of the present invention, the number of code words is prevented from decreasing in the maximum-likelihood decoder that uses the soft output Viterbi algorithm.

Figure 15:
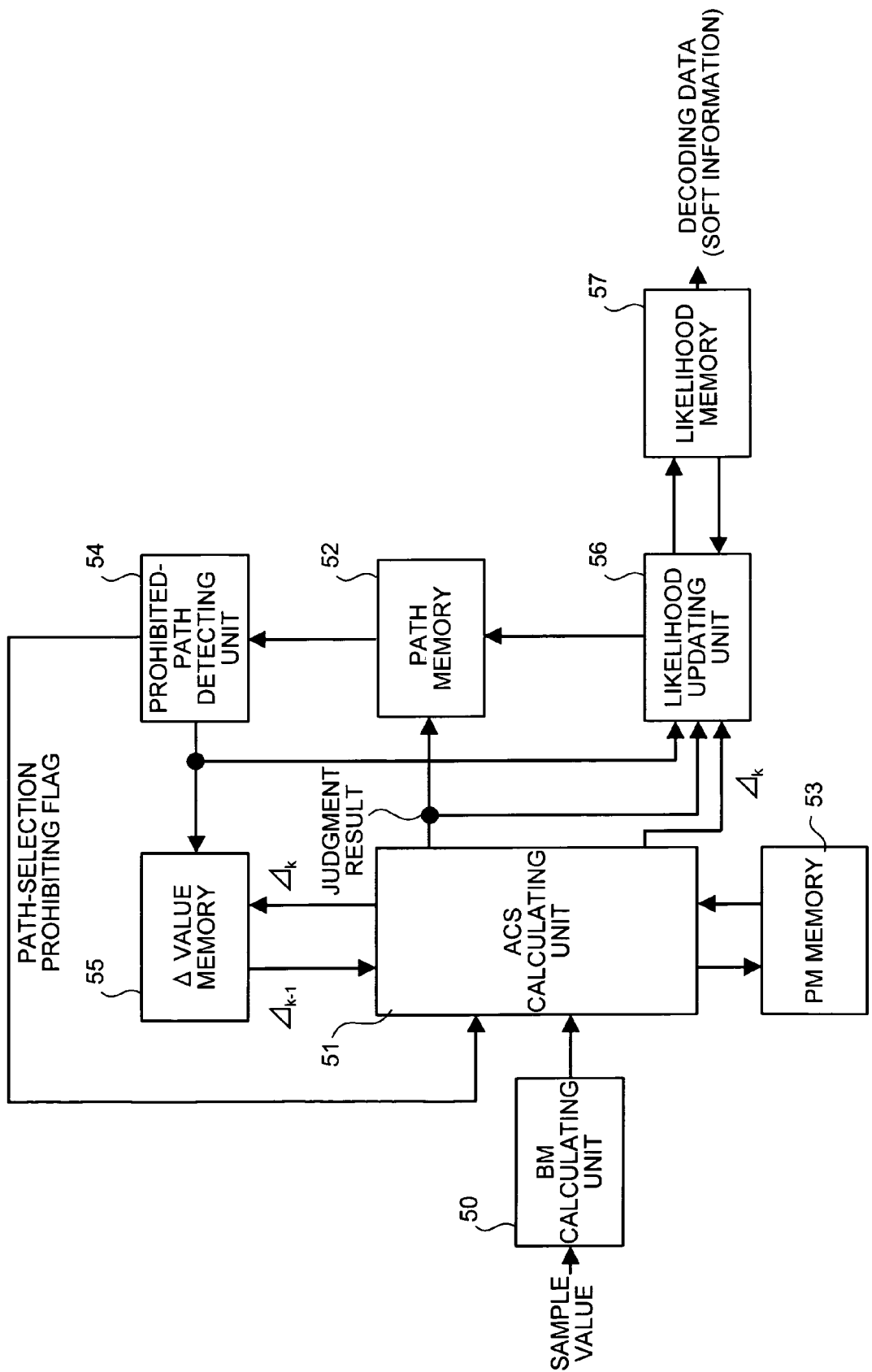
FIG. 15 is a diagram of a functional constitution of a maximum-likelihood decoder according to a sixth embodiment of the present invention.
Figure 16:
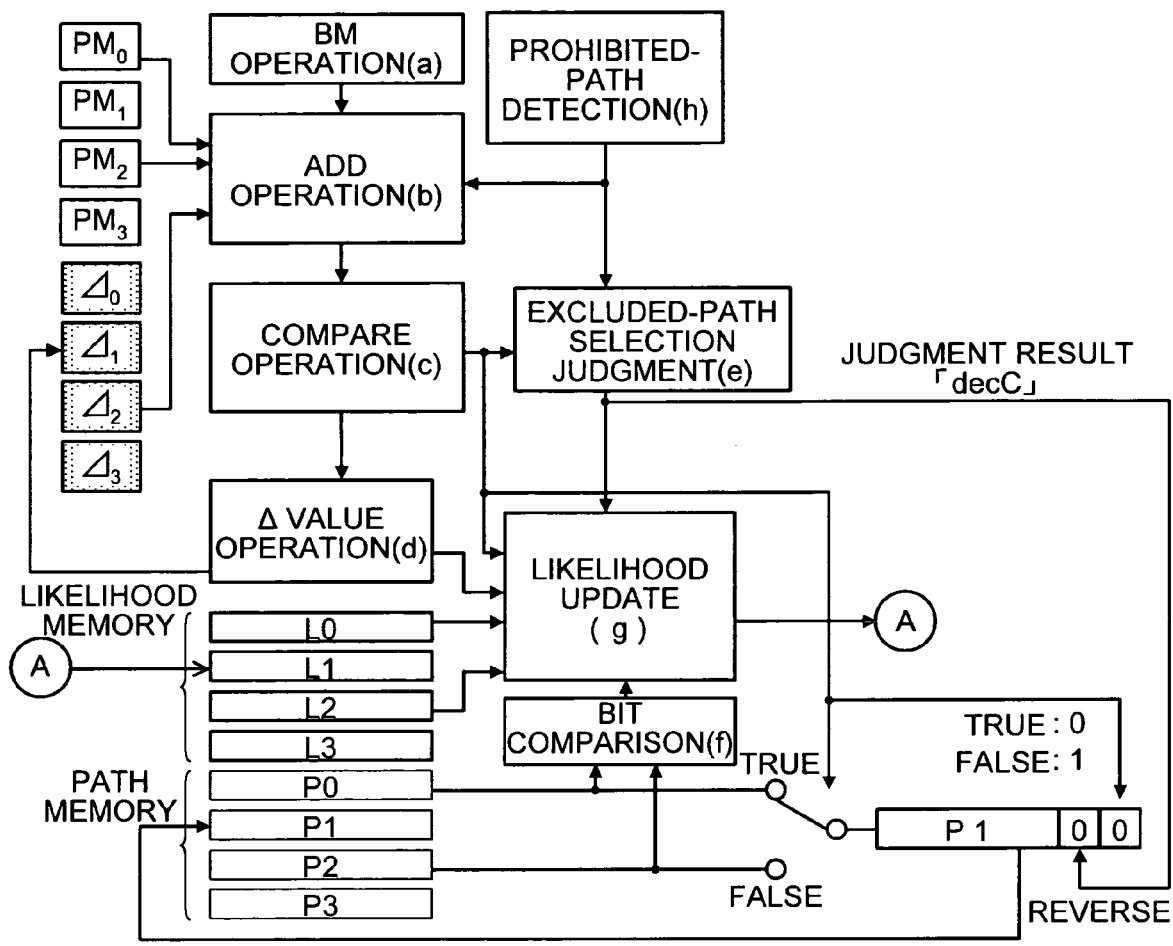
FIG. 16 is a diagram for explaining likelihood calculating process including deletion of a path.
Figure 17:
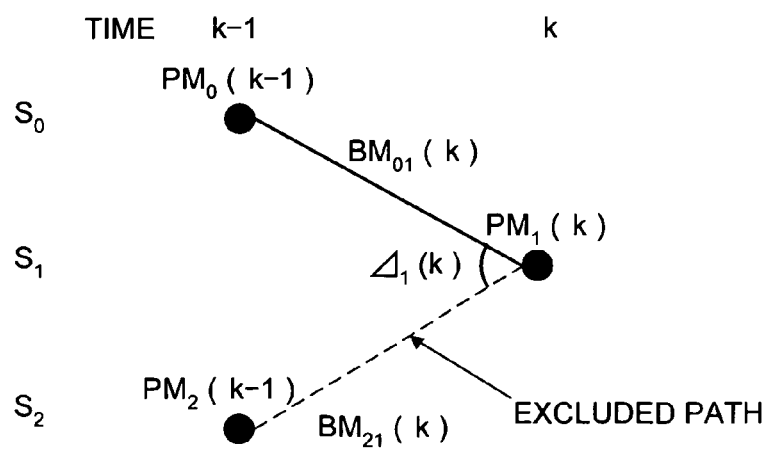
FIG. 17 is a trellis diagram at the time when a state transitions from a state $S_0$ and a state $S_2$ at time k−1 to a state $S_1$ at time k.

FIG. 15 is a diagram of a functional constitution of a maximum-likelihood decoder according to the sixth embodiment. FIG. 16 is a diagram for explaining likelihood calculating process including deletion of a path. FIG. 17 is a trellis diagram at the time when a state transitions from the state $S_0$ and the state $S_2$ at time k−1 to the state $S_1$ at time k.

As shown in FIG. 16, when a state transitions according to the state transition table of four states shown in FIG. 4, in particular, as shown in FIG. 17, two paths extend from the state $S_0$ and the state $S_2$ at time k−1 to the state $S_1$ at time k. One of the two paths is selected according to an ACS operation in the state $S_1$ at time k. However, paths set as objects of processing are not limited to these paths. It is possible to easily execute processing same as processing explained below on other paths.

As shown in FIG. 15, the maximum-likelihood decoder includes a BM calculating unit 50, an ACS calculating unit 51, a path memory 52, a PM memory 53, a prohibited-path detecting unit 54, a Δ value memory 55, a likelihood updating unit 56, and a likelihood memory 57.

The BM calculating unit 50 performs a BM operation ((a) in FIG. 16) for calculating a branch metric with respect to a sample value (a signal obtained by adding noise of a channel to a decoder input). Specifically, the BM calculating unit 50 calculates, according to Equation (1), a branch metric $BM_{mn}(k)$ at the time when a state transitions from the state $S_m$ to the state $S_n$ at time k.

The ACS calculating unit 51 performs an ACS operation for adding up a path metric in a state at time k−1 and a branch metric at the time when a state transitions from time k−1 to time k and selecting a path through comparison of magnitudes of path metrics in the state at time k obtained by the addition.

The ACS calculating unit 51 performs an ADD operation ((b) in FIG. 16) for calculating, using Equations 2 and 3, the path metrics $PM_n^0(k)$ and $PM_n^1(k)$ of the two paths that transition from the state $S_m$ and a state $S_{m'}$ to the state $S_n$ at time k.

However, the ACS calculating unit 51 acquires information indicating whether a path-selection prohibiting flag explained later is valid from the prohibited-path detecting unit 54. When there is a path for which the path-selection prohibiting flag is valid, the ACS calculating unit 51 excludes the path from objects of selection of a path.

In this case, if a path that transitions from the state $S_{m'}$ to the state $S_n$ is excluded from objects of selection of a path, the ACS calculating unit 51 performs the ADD operation ((b) in FIG. 16) for calculating, using Equations 9 and 10, the path metrics $PM_n^0(k)$ and $PM_n^1(k)$ of the two paths that transition from the state $S_m$ and a state $S_{m'}$ to the state $S_n$.

Thereafter, the ACS calculating unit 51 performs a COMPARE operation ((c) in FIG. 16) for comparing magnitudes of the path metrics $PM_n^0(k)$ and $PM_n^1(k)$ of the two paths and selecting a path based on Equation (4).

The ACS calculating unit 51 performs a Δ value operation ((d) in FIG. 16) for calculating, according to Equation (8) an absolute value of a difference between the path metrics $PM_n^0(k)$ and $PM_n^1(k)$ of the two paths. The difference between the path metrics calculated is used when there is a path excluded from objects of selection of a path in the ADD operation ((b) in FIG. 16) at the next time.

The ACS calculating unit 51 updates content of a path memory based on a result of the COMPARE operation ((c) in FIG. 16). In FIG. 16, content of a path memory of the state $S_1$ is updated.

When the result of the COMPARE operation ((c) in FIG. 16) is "true", the ACS calculating unit 51 adds a bit value "0" to the path memory of the state $S_1$ and updates content of the path memory of the state $S_1$.

In the COMPARE operation, assuming that $PM_n^0(k)$ in Equation (4) represents a path metric of the state $S_1$ corresponding to a transition path from the state $S_0$ to the state $S_1$ and $PM_n^1(k)$ represents a path metric of the state $S_1$ corresponding to a transition path from the state $S_2$ to the state $S_1$, when following equation is established, it is judged that the result is "true".

$$PM_n(k) = PM_n^0(k) \quad (12)$$

When following equation is established, it is judged that the result is "false".

$$PM_n(k) = PM_n^1(k) \quad (13)$$

When the result of the COMPARE operation ((c) in FIG. 16) is "false", the ACS calculating unit 51 adds a bit value "1" to the path memory of the state $S_1$ and updates content of the path memory.

Moreover, the ACS calculating unit 51 performs excluded-path selection judgment ((e) in FIG. 16) for judging whether a path-selection prohibiting flag is valid and, when the path-selection prohibiting flag is valid, judging whether a path for which the path-selection prohibiting flag is valid is selected in the COMPARE operation ((c) in FIG. 16).

FIG. 18 is a table of judgment criteria in the excluded-path selection judgment. As shown in FIG. 18, when the path-selection prohibiting flag is invalid, the ACS calculating unit 51 sets a judgment result as "decA".

When the path-selection prohibiting flag is valid and a path different from an excluded path is selected in path selection processing, the ACS calculating unit 51 sets the judgment result as "decB". When the path-selection prohibiting flag is valid and the excluded path is selected in the path selection processing, the ACS calculating unit 51 sets the judgment result as "decC".

When the judgment result of the excluded-path selection judgment ((e) in FIG. 16) is "decC", as in the case of the fifth embodiment, the ACS calculating unit 51 reverses a bit value at time immediately before the bit value added to the path memory of the state $S_1$ anew and updates content of the path memory of the state $S_1$.

Referring back to FIG. 15, the path memory 52 (P0 to P3 in FIG. 16) stores information on a selected path. The information stored in the path memory 52 is referred to by the prohibited-path detecting unit 54 and the likelihood updating unit 56.

The PM memory 53 stores a path metric calculated by the ACS calculating unit 51. The path metric stored by the PM memory 53 is read out by the ACS calculating unit 51 when the ACS operation is executed at the next time k+1.

As explained according to the first or the second embodiment, the prohibited-path detecting unit 54 performs, for each bit, detection of coincidence of values between a specific prohibited pattern and a path memory. When there is a path in which all bits coincide with the prohibited pattern, the prohibited-path detecting unit 54 performs prohibited path detection ((h) in FIG. 16) for validating a path-selection prohibiting flag corresponding to the path. Setting of the path-selection prohibiting flag may be performed by counting bits as explained in the third or the fourth embodiment.

The Δ value memory 55 (L0 to L3 in FIG. 16) stores a difference $\Delta n(k)$ between path metrics calculated by the ACS calculating unit 51 using Equation (8). When a path is deleted, the ACS calculating unit 51 calculates a path metric using Equation (10) with reference to a value stored in the Δ value memory 35.

The likelihood updating unit 56 updates information on a logarithmic likelihood ratio of a survival path stored in the likelihood memory 57 ((g) in FIG. 16).

The likelihood updating unit 56 compares, for each bit, bit values stored in the path memory 52 for each state based on a result of the COMPARE operation ((c) in FIG. 16) and the excluded-path selection judgment ((e) in FIG. 16) by the ACS calculating unit 51. The likelihood updating unit 56 calculates a logarithmic likelihood ratio of the state $S_n$ at time k and updates content of the likelihood memory 57 by storing the logarithmic likelihood ratio calculated in the likelihood memory 57.

FIG. 19 is a table for explaining a method of calculating a logarithmic likelihood ratio. As shown in FIG. 19, the method of calculating a logarithmic likelihood ratio is different depending on an operation result of the COMPARE operation ((c) in FIG. 16) and a judgment result of the excluded-path selection judgment ((e) in FIG. 16). In FIG. 19, when the judgment result is "decA", the method of calculating a logarithmic likelihood ratio is the same as the conventional soft output Viterbi algorithm.

The conventional soft output Viterbi algorithm is explained in detail in "M. P. C. Fossorier, F. Burkert, S. Lin, j. Hagenauer, 'On the equivalence between SOVA and MAX-Log-MAP decodings', IEEE Commun. Letters, vol. 2, No. 5, May 1998", "Isaka, Imai, 'Guide to Shannon Limit: 'Parallel concatenated (Turbo) coding', 'Turbo (iterative) decoding', and peripheries thereof', Shingakugiho, It98-51, 1998.12.", and the like.

When the judgment result is "decA", the operation result of the COMPARE operation ((c) in FIG. 16) is "true", and following equation is established $$\hat{u}_j^0 \neq \hat{u}_j^2 \quad (14)$$

a logarithmic likelihood ratio in the state S1 at time k is calculated according to following equation $$\hat{L}_j(S_1(k)) = \min\{\Delta_1(k), \hat{L}_j^0\} \quad (15)$$

where $$\hat{u}_j^0, \hat{u}_j^2$$

are a decoded value of an information bit $u_j^0$ of the state $S_0$ at time j (j<k) and a decoded value of an information bit $u_j^2$ of the state $S_2$ at time j, respectively.

In addition, $$\hat{L}_j^0$$

is a logarithmic likelihood ratio of an a posteriori probability with respect to the decoded value of the information bit $u_j^0$.

When the judgment result is "decA", the operation result of the COMPARE operation ((c) in FIG. 16) is "true", and following equation is established, $$\hat{u}_j^0 = \hat{u}_j^2 \quad (16)$$

a logarithmic likelihood ratio of the state $S_1$ at time k is calculated according to following equation $$\hat{L}_j(S_1(k)) = \min\{\Delta_1(k) + \hat{L}_j^2, \hat{L}_j^0\} \quad (17)$$

where $$\hat{L}_j^2$$

is a logarithmic likelihood ratio of an a posteriori probability with respect to the decoded value of the information bit $u_j^2$.

When the judgment result is "decA", the operation result of the COMPARE operation ((c) in FIG. 16) is "false", and the relation of Equation (12) is satisfied, a logarithmic likelihood ratio of the state $S_1$ at time k is calculated according to following equation.

$$\hat{L}_j(S_1(k)) = \min\{\Delta_1(k), \hat{L}_j^2\} \quad (18)$$

When the judgment result is "decA", the operation result of the COMPARE operation ((c) in FIG. 16) is "false", and the relation of Equation (16) is satisfied, a logarithmic likelihood ratio of the state $S_1$ at time k is calculated according to following equation.

$$\hat{L}_j(S_1)(k)) = \min\{\Delta_1(k) + \hat{L}_j^0, \hat{L}_j^2\} \quad (19)$$

When the judgment result is "decC", regardless of the operation result of the COMPARE operation ((c) in FIG. 16) and regardless of whether the relations of Equations 14 and 16 are satisfied, a logarithmic likelihood ratio of the state $S_1$ at time k is calculated according to following equation.

$$\hat{L}_j(S_1(k)) = \hat{L}_j^0 \quad (20)$$

In this case, a logarithmic likelihood ratio of the decoded value of the information bit $u_j^0$ corresponding to the state $S_0$ at a transition source of a path not excluded from candidates of selection of a path is used as the logarithmic likelihood ratio of the state $S_1$ at time k Thereafter, the likelihood updating unit 56 stores the logarithmic likelihood ratio calculated in the likelihood memory 57 and updates content of the likelihood memory 57. The likelihood memory 57 stores the logarithmic likelihood ratio calculated by the likelihood updating unit 56. The logarithmic likelihood ratio stored in the likelihood memory 57 is outputted as soft information decoding data.

As described above, according to the sixth embodiment, when selection of a path is executed by the ACS calculating unit 51, the likelihood updating unit 56 generates likelihood information of a state at a transition destination of a selected path based on likelihood information concerning a decoding result at a point in the past in a state of a transition source of the path as represented by Equation (20). Thus, it is possible to easily constitute a soft output decoder that prevents the number of code words to be candidates of a decoding result from decreasing and minimizes a loss of a gain.

In the explanations according to the first to the sixth embodiments, a path not satisfying a predetermined limitation is deleted. However, when error positions disperse and long error phenomena often occur, an encoder and a decoder may be constituted to be capable of coping with these problems.

For example, a low-density-parity-check (LDPC) code attracts attention as a most likely candidate of a signal processing technology in the next generation. The LDPC code is a technology for adding parity data for sparse error detection to a data division to perform recording processing in a recording medium and, at the time of reproduction, alternately executing partial response detection and parity check a plurality of times using soft decoding information to thereby improve reliability of decoding data.

However, the LDPC code has a disadvantage that error positions disperse and long error phenomena often occur. Therefore, a satisfactory result is not obtained when the LDPC code and an Error Correcting Code (ECC) are simply combined.

To compensate for such a disadvantage, it is conceivable to use the MTR code that limits the number of consecutive transitions of a code (the number of consecutive bits of 1). However, even if the MTR code is used, although it is possible to control the occurrence of long error phenomena, the problem of dispersing error positions is not still solved.

Therefore, when decoding for an MTR coded sequence is performed, error propagation is caused by only a few errors are present and reliability of a decoded sequence is deteriorated. Thus, according to a seventh embodiment of the present invention, occurrence of long error phenomena and error propagation is controlled to improve reliability of a decoded sequence.

Figure 20:
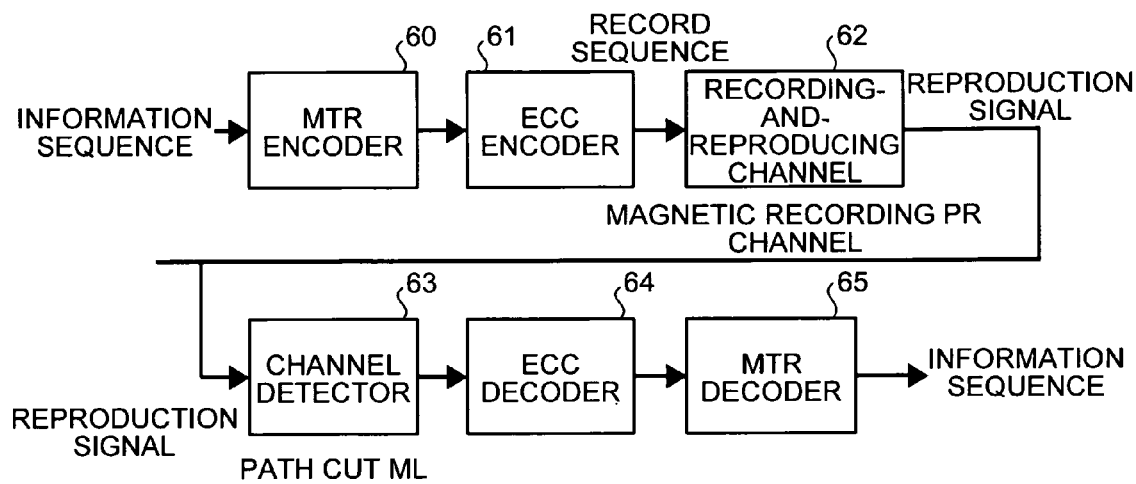
FIG. 20 is a diagram for explaining a functional constitution of a recording-and-reproducing apparatus according to a seventh embodiment of the present invention.

FIG. 20 is a diagram for explaining a functional constitution of a recording-and-reproducing apparatus according to the seventh embodiment. This recording-and-reproducing apparatus includes an MTR encoder 60, an ECC encoder 61, a recording-and-reproducing channel 62, a channel detector 63, an ECC decoder 64, and an MTR decoder 65.

The MTR encoder 60 performs MTR encoding for an information sequence. The ECC encoder 61 performs ECC encoding for a code sequence encoded by the MTR encoder 60. The recording-and-reproducing channel 62 is a magnetic recording PR channel that records a recording sequence outputted from the ECC encoder 61 in a magnetic medium or the like and reproduces the recording sequence.

The channel detector 63 applies channel detection to a signal reproduced by the recording-and-reproducing channel 62 while excluding a path that suits a characteristic of a channel and does not satisfy a predetermined limitation by the MTR code from candidates of selection of a path according to the maximum likelihood method explained in the first to the fifth embodiments. In this embodiment, a path is dynamically excluded as explained in the first to the fifth embodiments. However, other methods such as the method of statically excluding a path as explained with reference to FIG. 30 may be used.

The ECC decoder 64 performs error correction using an Error Correcting Code (ECC) included in the channel detection sequence detected by the channel detector 63. The MTR decoder 65 performs MTR decoding for a code sequence for which error correction is performed by the ECC decoder 64 and outputs an information sequence.

In this way, in the recording-and-reproducing apparatus, the MTR decoding is performed after the ECC decoding is performed. Thus, it is possible to correct, before execution of the MTR decoding, an error that causes error propagation at the time of the MTR decoding and control the error propagation.

Figure 21:
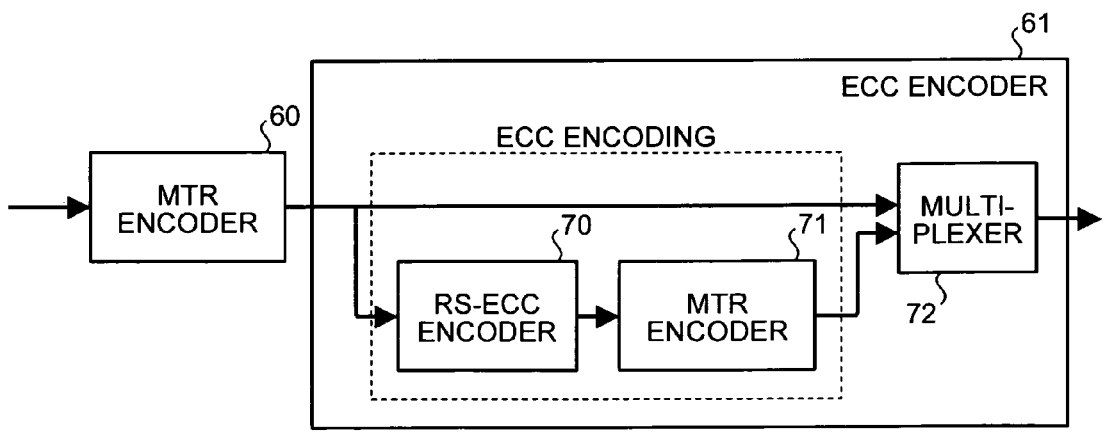
FIG. 21 is a diagram for explaining a constitution of an ECC encoder that generates a recording sequence.
Figure 22:
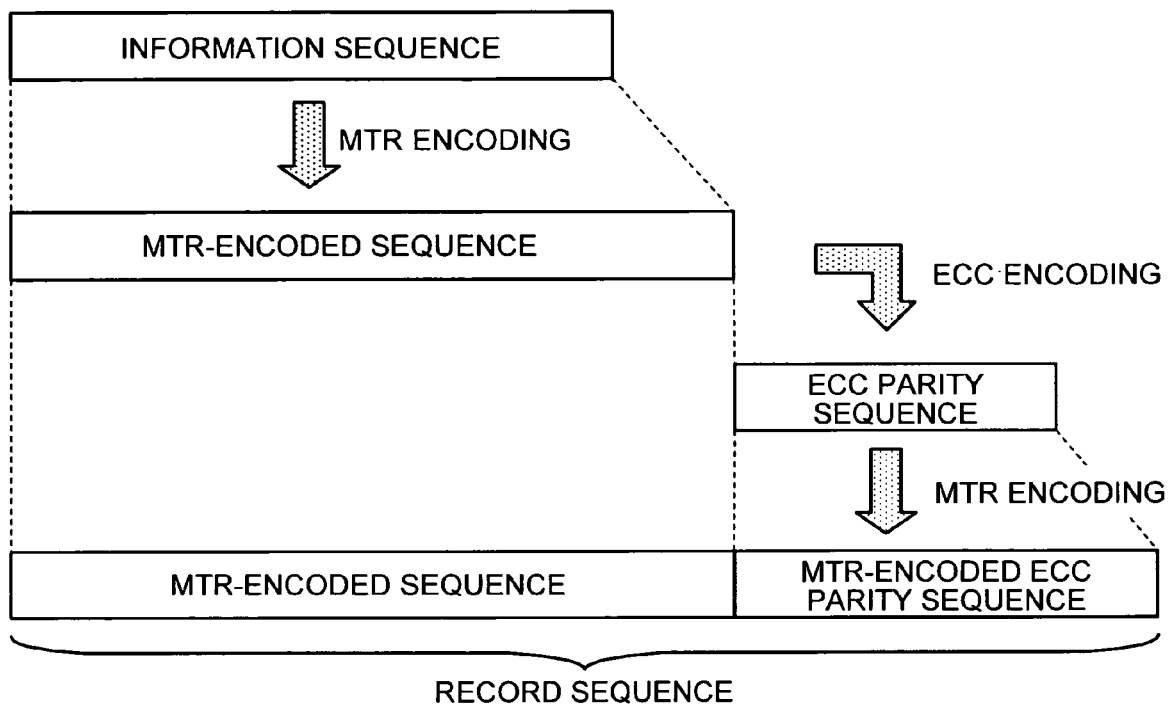
FIG. 22 is a diagram for explaining generation processing for a recording sequence.

FIG. 21 is a diagram for explaining a constitution of the ECC encoder 61 that generates a recording sequence. FIG. 22 is a diagram for explaining processing for generating a recording sequence.

As shown in FIG. 21, the ECC encoder 61 includes an RS-ECC encoder 70, an MTR encoder 71, and a multiplexer 72. The ECC encoder 61 inputs an MTR-encoded sequence subjected to MTR encoding by the MTR encoder 60 to the RS-ECC encoder 70 and the multiplexer 72.

The RS-ECC encoder 70 subjects an MTR-encoded sequence to ECC encoding using a Reed-Solomon code to generate an ECC parity sequence as shown in FIG. 22. The MTR encoder 71 subjects the ECC parity sequence generated by the RS-ECC encoder 70 to MTR encoding to generate an MTR-encoded ECC parity sequence.

The multiplexer 72 combines the MTR-encoded sequence received from the MTR encoder 60 and the MTR-encoded ECC parity sequence received from the MTR encoder 71 to generate a recording sequence.

Figure 23:
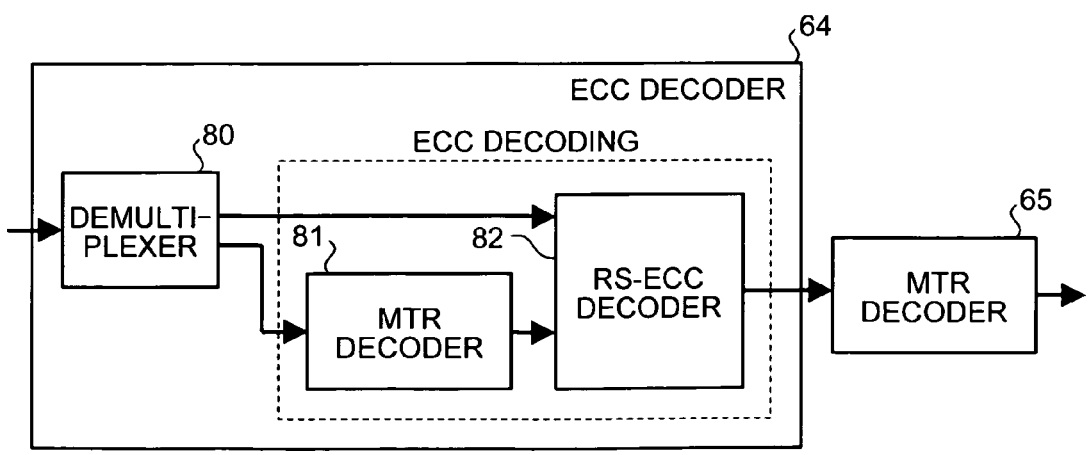
FIG. 23 is a diagram for explaining a constitution of an ECC decoder that decodes a channel detection sequence.
Figure 24:
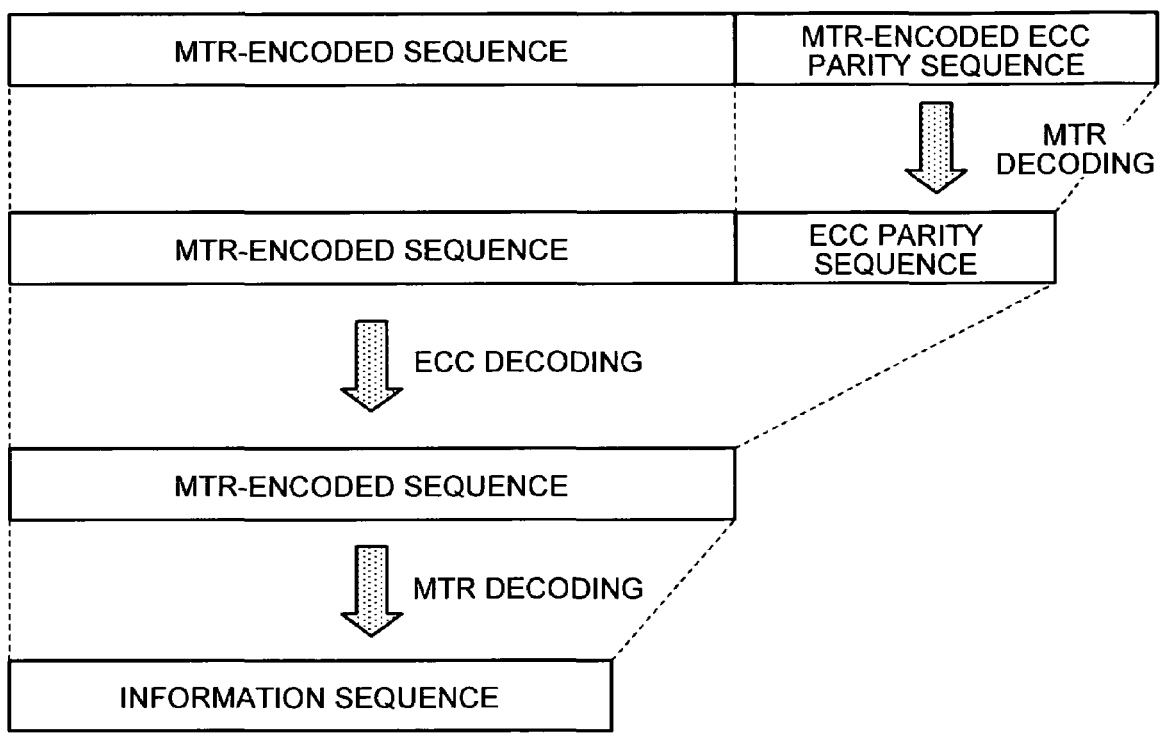
FIG. 24 is a diagram for explaining decoding processing for a channel detection sequence.

FIG. 23 is a diagram for explaining a constitution of the ECC decoder 64 that decodes a channel detection sequence. FIG. 24 is a diagram for explaining decoding processing for the channel detection sequence.

As shown in FIG. 23, the ECC decoder 64 includes a demultiplexer 80, an MTR decoder 81, and an RS-ECC decoder 82. The demultiplexer 80 divides a channel detection sequence detected by the channel detector 63 into an MTR-encoded sequence and an MTR-encoded ECC parity sequence and outputs the MTR-encoded sequence and the MTR-encoded ECC parity sequence to the RS-ECC decoder 82 and the MTR decoder 81, respectively.

The MTR decoder 81 subjects the MTR-encoded ECC parity sequence received from the demultiplexer 80 to MTR decoding to generate an ECC parity sequence as shown in FIG. 24 and outputs the ECC parity sequence to the RS-ECC decoder 82.

The RS-ECC decoder 82 subjects the MTR-encoded sequence received from the demultiplexer 80 and the ECC parity sequence received from the MTR decoder 81 to ECC decoding to generate an MTR-encoded sequence and outputs the MTR-encoded sequence to the MTR decoder 65.

According to the seventh embodiment, the recording-and-reproducing apparatus that performs maximum likelihood decoding using the Viterbi decoding method is explained. However, in a recording-and-reproducing apparatus that performs maximum likelihood decoding using the Soft Output Viterbi Algorithm (SOVA), it is also possible to control error propagation at the time of MTR decoding by performing error correction before execution of the MTR decoding.

Figure 25:
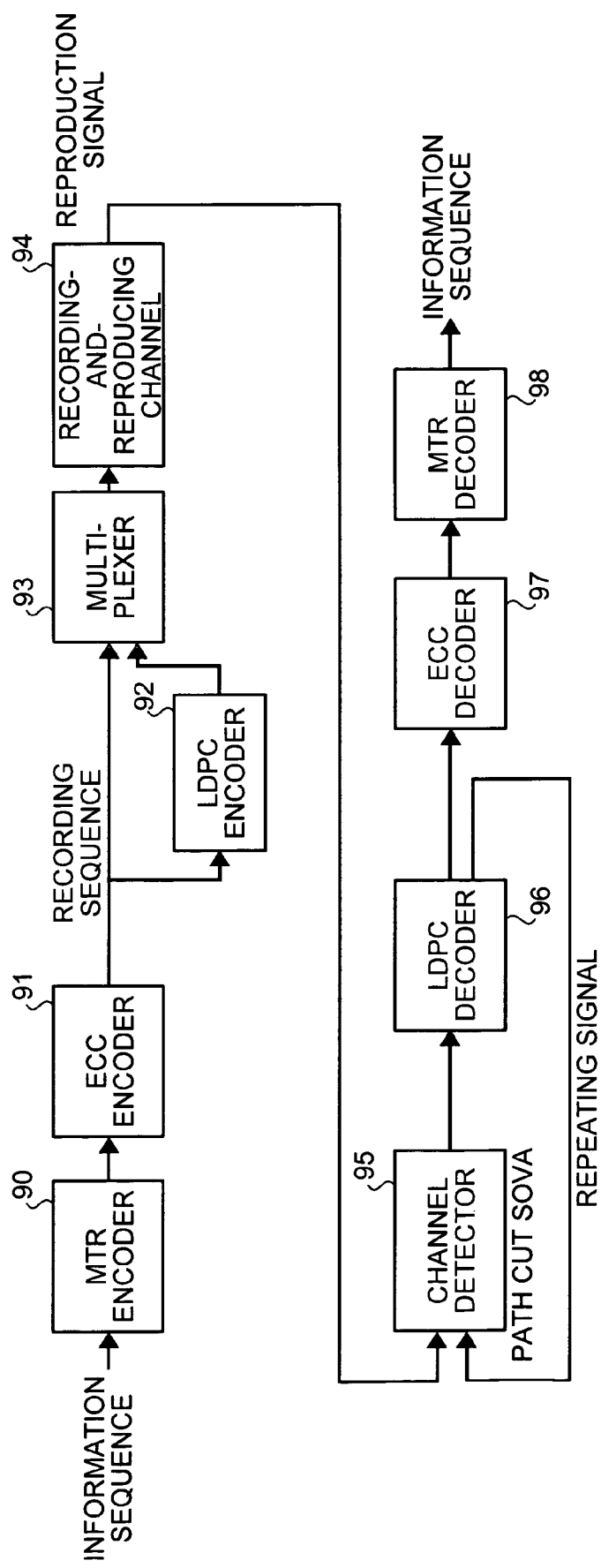
FIG. 25 is a diagram for explaining a functional constitution of a recording-and-reproducing apparatus that performs likelihood decoding using a soft output Viterbi algorithm.
Figures 26, 27:
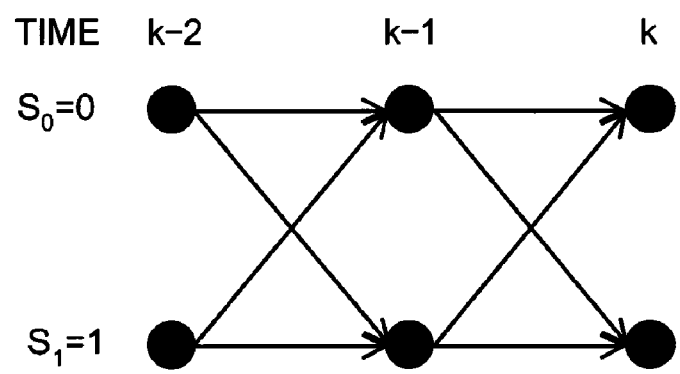
FIG. 26 is a state transition table in a conventional PR1ML system.
FIG. 27 is a trellis diagram in the conventional PR1ML system.
Figure 28:
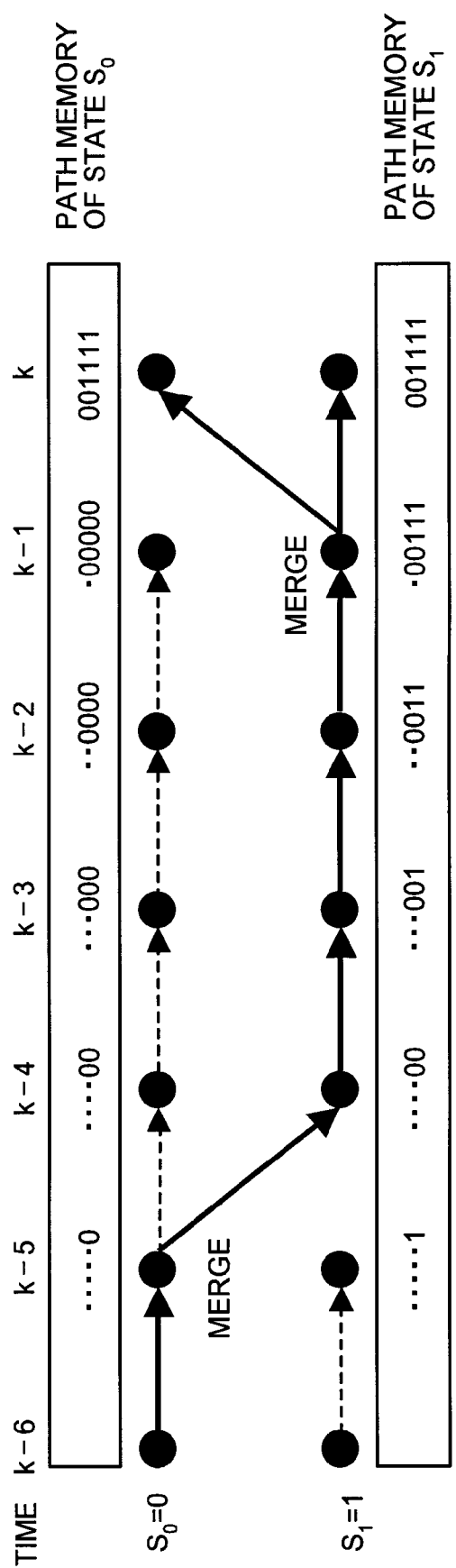
FIG. 28 is a diagram for explaining path selection processing that uses a conventional Viterbi decoding method.
Figure 29:
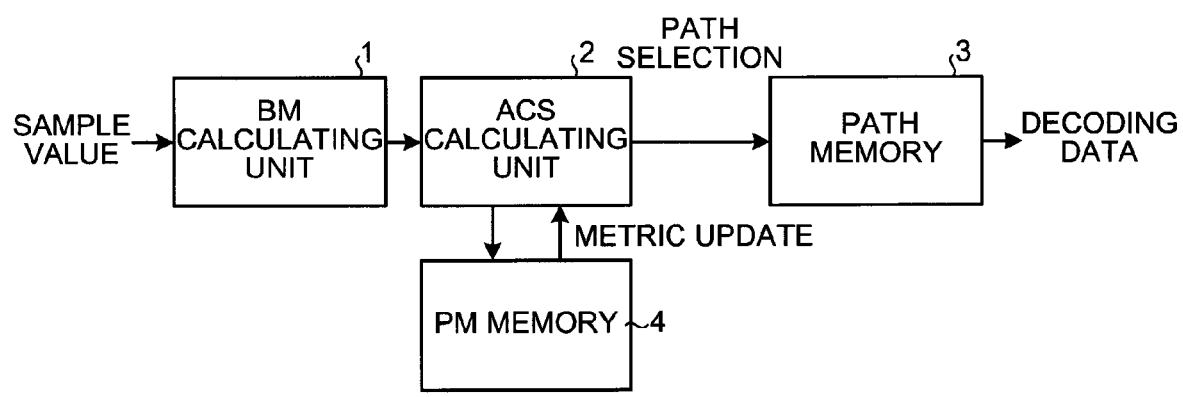
FIG. 29 is a diagram of a functional constitution of a conventional maximum-likelihood decoder.

FIG. 25 is a diagram for explaining a functional constitution of a recording-and-reproducing apparatus that performs maximum likelihood decoding using the soft output Viterbi algorithm. This recording-and-reproducing apparatus includes an MTR encoder 90, an ECC encoder 91, an LDPC encoder 92, a multiplexer 93, a recording-and-reproducing channel 94, a channel detector 95, an LDPC decoder 96, an ECC decoder 97, and an MTR decoder 98.

The MTR encoder 90 performs MTR encoding for an information sequence. The ECC encoder 91 subjects an encoded sequence encoded by the MTR encoder 90 to ECC encoding to generate a recording sequence and outputs the recording sequence generated to the LDPC encoder 92 and the multiplexer 93.

The LDPC encoder 92 subjects the recording sequence generated by the ECC encoder 91 to LDPC encoding to generate an LDPC encoded sequence and outputs the LDPC encoded sequence to the multiplexer 93. The multiplexer 93 combines the recording sequence generated by the ECC encoder 91 and the LDPC encoded sequence generated by the LDPC encoder 92 to generate a channel recording sequence.

The recording-and-reproducing channel 94 is a magnetic recording PR channel that records the channel recording sequence outputted from the multiplexer 93 in a magnetic medium or the like and reproduces the recording sequence.

The channel detector 95 applies channel detection to a signal reproduced by the recording-and-reproducing channel 94 while excluding a path that suits a characteristic of a channel and does not satisfy a predetermined limitation by the MTR code from candidates of selection of a path according to the method explained according to the sixth embodiment. In this embodiment, a path is dynamically excluded as explained according to the sixth embodiment. However, other methods such as the method of statically excluding a path as explained with reference to FIG. 30 may be used.

The LDPC decoder 96 decodes a channel detection sequence detected by performing update of likelihood information, which is exchanged between the LDPC decoder 96 and the channel detector 95, a predetermined number of times and outputs an LDPC decoded sequence obtained as a result of the decoding to the ECC decoder 97.

The ECC decoder 97 performs error correction using an Error Correcting Code (ECC) included in the LDPC decoded sequence received from the LDPC decoder 96. The MTR decoder 98 applies MTR decoding to a code sequence for which error correction is performed by the ECC decoder 97 and outputs an information sequence.

In this way, in the recording-and-reproducing apparatus that performs maximum likelihood decoding using the soft output Viterbi algorithm, it is also possible to correct, before execution of MTR decoding, an error that causes error propagation at the time of the MTR decoding and control the error propagation by performing the MTR decoding after ECC decoding is performed.

As described above, according to the seventh embodiment, the ECC decoders 64 and 97 perform error correction using an error correcting code included in a code sequence and the MTR decoders 65 and 98 decode the code sequence encoded using the MTR code after the error correction is performed by the ECC decoders 64 and 97. Thus, it is possible to correct, before execution of MTR decoding, an error that causes error propagation at the time of the MTR decoding and control the error propagation.

According to the seventh embodiment, the channel detector 95 and the LDPC decoder 96 perform decoding of a code sequence by excluding a path that does not satisfy a predetermined condition among paths representing transitions of states in trellis diagrams from objects of selection of a path to select a path. The ECC decoder 97 performs error correction using an error correcting code included in the code sequence decoded. Thus, it is possible to correct, before execution of MTR decoding, an error that causes error propagation at the time of the MTR decoding and control the error propagation while satisfying the predetermined condition.

Furthermore, according to the seventh embodiment, the MTR decoders 60 and 90 encode an information sequence using the MTR code and the ECC encoders 61 and 91 encode an encoded sequence encoded by the MTR decoders 60 and 90 using an error correcting code. Thus, it is possible to generate an encoded sequence that can correct, before execution of MTR decoding, an error that causes error propagation at the time of the MTR decoding using the error correction code.

The embodiments of the present invention have been explained. However, other than the embodiments described above, the present invention may be carries out in various different embodiments within a scope of a technical idea described in claims. For example, the present invention is applied not only to a decoder for a magnetic disk device but also to a decoder for an optical disk and communication.

Among the respective kinds of processing explained in the embodiments, all or a part of the kinds of processing explained as being automatically performed may be manually performed. All or a part of the kinds of processing explained as manually performed may be automatically performed according to a publicly known method.

Besides, it is possible to arbitrarily change the processing procedures, the control procedures, the specific names, and the information including various data and parameters unless specifically noted otherwise.

The respective components of the decoder shown in the figures are functionally conceptual and are not always required to be physically constituted as shown in the figure. In other words, specific forms of distribution and integration of the components of the decoder are not limited to those shown in the figures. It is possible to constitute all or a part of the components to be functionally or physically distributed and integrated by an arbitrary unit according to various loads, states of use, and the like.

Moreover, all or a part of the various processing functions performed in the decoder can be realized by a CPU and programs analyzed and executed by the CPU or can be realized as hardware according to the wired logic.

According to an embodiment of the present invention, when a path at time k is selected, information concerning a selection history of paths selected at time before time (k−(a constraint length of a code)+1) is stored and a path that should be excluded from objects of selection of a path is detected based on the information stored and information on a state at a transition source at the time when a state transitions from time k−1 to time k. Thus, there is an effect that it is possible to efficiently delete a path that does not satisfy a predetermined limitation to obtain a large gain without increasing the constraint length of the code.

Furthermore, according to an embodiment of the present invention, coincidence judgment for bits is performed between a bit string in the stored information and a specific bit string. A path that should be excluded from objects of selection of a path is detected based on a result of the coincidence judgment. Thus, there is an effect that it is possible to efficiently detect the path that should be excluded.

Moreover, according to an embodiment of the present invention, the specific bit string is a bit string in which bits consecutively reverse. Thus, there is an effect that it is possible to efficiently limit the number of consecutive transitions in the bit string.

Furthermore, according to an embodiment of the present invention, the specific bit string is a bit string in which identical bits are consecutive. Thus, there is an effect that it is possible to efficiently limit the number of consecutive identical bits in the bit string.

Moreover, according to an embodiment of the present invention, a path that should be excluded from objects of selection of a path is detected by counting bits in a bit string in the stored information. Thus, there is an effect that it is possible to efficiently detect the path that should be excluded.

Furthermore, according to an embodiment of the present invention, a path that should be excluded from objects of selection of a path is detected by counting bits that consecutively reverse in a bit string. Thus, there is an effect that it is possible to efficiently limit the number of consecutive transitions in the bit string.

Moreover, according to an embodiment of the present invention, a path that should be excluded from objects of selection of a path is included in the objects of selection of a path by changing a path selected in the path leading to a detected path and selection of a path is executed. Thus, there is an effect that it is possible to prevent the number of code words to be candidates of a decoding result from decreasing and minimize a loss of a gain.

Furthermore, according to an embodiment of the present invention, when selection of a path is executed, likelihood information of a state at a transition destination of the path selected is generated based on likelihood information concerning a decoding result at a point in the past in a state at a transition source of the path. Thus, there is an effect that it is possible to easily constitute a soft output decoder that prevents the number of code words to be candidates of a decoding result from decreasing and minimizes a loss of a gain.

Moreover, according to an embodiment of the present invention, error correction is performed using an error correcting code included in a code sequence and, after the error correction is performed, a code sequence encoded using the MTR code is decoded. Thus, there is an effect that it is possible to correct, before execution of MTR decoding, an error that causes error propagation at the time of the MTR decoding and control the error propagation.

Furthermore, according to an embodiment of the present invention, decoding of a code sequence is performed by excluding a path that does not satisfy a predetermined condition in paths representing transitions of states in trellis diagrams from objects of selection of a path to select a path and error correction is performed using an error correcting code included in the code sequence decoded. Thus, there is an effect that there is an effect that it is possible to correct, before execution of MTR decoding, an error that causes error propagation at the time of the MTR decoding while satisfying the predetermined condition and control the error propagation.

Moreover, according to an embodiment of the present invention, an information sequence is encoded using the MTR code and an encoded sequence is encoded using an error correcting code. Thus, there is an effect that it is possible to generate an encoded sequence that can correct, before execution of MTR decoding, an error that causes error propagation at the time of the MTR decoding using the error correcting code.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A decoder that decodes a code by selecting, based on a predetermined condition, a path out of paths representing a transition of each of a plurality of states in a trellis diagram, the decoder comprising:
   a storing unit that stores a value of a first bit of bits representing a state of a source of the transition in the trellis diagram as information on a selection history of a path selected before time (k−(a constraint length of a code)+1) by adding the value to path selection history information on paths selected by time k−1 when a path at time k is selected;
   a path detecting unit that detects a path to be excluded from a path selection candidate, based on the information stored in the storing unit and information on a state of a transition source when a state transition occurs between time k−1 and time k; and
   a decoding unit that decodes a code by deleting the path detected by the path detecting unit.

2. The decoder according to claim 1, wherein
the path detecting unit performs coincidence judgment for each bit between a bit string in the information stored in the storing unit and a specific bit string, and detects the path to be excluded from the path selection candidate based on a result of the coincidence judgment.

3. The decoder according to claim 2, wherein
the specific bit string is a bit string in which bits are consecutively reversed.

4. The decoder according to claim 2, wherein
the specific bit string is a bit string in which identical bits are consecutive.

5. The decoder according to claim 1, wherein
the path detecting unit detects the path to be excluded from the path selection candidate by counting bits of a bit string in the information stored in the storing unit.

6. The decoder according to claim 5, wherein
the path detecting unit counts bits that are consecutively reversed in the bit string.

7. The decoder according to claim 5, wherein
the path detecting unit counts identical bits that continue in the bit string.

8. The decoder according to claim 1, further comprising:
a path selecting unit that includes the path to be excluded from the path selection candidate in the path selection candidate by changing a path that leads to the path detected by the path detecting unit, which has been selected before, and executes selection of a path.

9. The decoder according to claim 8, further comprising:
a likelihood-information generating unit that generates, when the selection of a path is executed by the path selecting unit, likelihood information of a state of a transition destination of a selected path, based on likelihood information concerning a decoding result at a point in a past in a state of a transition source of the path.

10. A method of decoding a code by selecting, based on a predetermined condition, a path out of paths representing a transition of each of a plurality of states in a trellis diagram, the method comprising:
   storing a value of a first bit of bits representing a state of a source of the transition in the trellis diagram as information on a selection history of a path selected before time (k−(a constraint length of a code)+1) by adding the value to path selection history information on paths selected by time k−1 when a path at time k is selected;
   detecting a path to be excluded from a path selection candidate, based on the information stored at the storing and information on a state of a transition source when a state transition occurs between time k−1 and time k;
   decoding a code by selecting the path detected by the detecting.

* * * * *